United States Patent
Lee et al.

(10) Patent No.: US 12,310,127 B2
(45) Date of Patent: May 20, 2025

(54) IMAGE SENSOR INCLUDING A TRANSISTOR WITH A VERTICAL CHANNEL AND A METHOD OF MANUFACTURING THE SAME

(71) Applicant: SAMSUNG ELECTRONICS CO., LTD., Suwon-si (KR)

(72) Inventors: Wonseok Lee, Suwon-si (KR); Eunsub Shim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 17/743,788

(22) Filed: May 13, 2022

(65) Prior Publication Data

US 2022/0384512 A1    Dec. 1, 2022

(30) Foreign Application Priority Data

Jun. 1, 2021   (KR) ................... 10-2021-0070967
Aug. 17, 2021  (KR) ................... 10-2021-0108178

(51) Int. Cl.
  *H01L 27/146*   (2006.01)
  *H10F 39/00*    (2025.01)
  *H10F 39/18*    (2025.01)

(52) U.S. Cl.
  CPC .......... *H10F 39/18* (2025.01); *H10F 39/014* (2025.01); *H10F 39/802* (2025.01); *H10F 39/8037* (2025.01); *H10F 39/805* (2025.01); *H10F 39/807* (2025.01); *H10F 39/811* (2025.01)

(58) Field of Classification Search
  None
  See application file for complete search history.

(56) References Cited

U.S. PATENT DOCUMENTS

| 7,364,960 B2 | 4/2008 | Lyu |
| 7,535,037 B2 | 5/2009 | Lyu |
| 7,749,831 B2 | 7/2010 | Lyu |

(Continued)

FOREIGN PATENT DOCUMENTS

| EP | 3 358 622 | 8/2018 |
| EP | 3748688   | 12/2020 |

(Continued)

OTHER PUBLICATIONS

European Search Report issued in corresponding EP Patent Application No. 22170223.6 on Mar. 6, 2023.

(Continued)

*Primary Examiner* — William C Trapanese
(74) *Attorney, Agent, or Firm* — MORGAN, LEWIS & BOCKIUS LLP

(57) ABSTRACT

An image sensor includes: photodiodes arranged in a substrate; active pillars connected to the photodiodes and extending in a vertical direction perpendicular to a bottom surface of the substrate; at least two transistors stacked in the vertical direction, wherein portions of the active pillars are channel areas of the at least two transistors; a floating diffusion (FD) area disposed under a transfer transistor, which is one of the at least two transistors, wherein the FD area is configured to receive charge from the photodiode through the transfer transistor and the portions of the active pillars; and a light transmitting layer disposed on a top surface of the substrate.

19 Claims, 35 Drawing Sheets

(56) References Cited

U.S. PATENT DOCUMENTS

| | | |
|---|---|---|
| 7,893,468 B2 | 2/2011 | Gambino et al. |
| 8,748,945 B2 | 6/2014 | Shin |
| 8,773,562 B1 | 7/2014 | Fan |
| 9,245,917 B2 | 1/2016 | Fan |
| 9,356,061 B2 | 5/2016 | Fan et al. |
| 9,356,067 B2 | 5/2016 | Shin |
| 9,406,713 B2 | 8/2016 | Fan |
| 9,406,714 B2 | 8/2016 | Jung et al. |
| 9,490,283 B2 | 11/2016 | Yu et al. |
| 9,515,116 B1 | 12/2016 | Sze et al. |
| 9,520,427 B1 | 12/2016 | Yoo et al. |
| 9,620,540 B1 | 4/2017 | Yang et al. |
| 9,627,430 B2 | 4/2017 | Kao et al. |
| 9,728,575 B1 | 8/2017 | Lee et al. |
| 9,735,197 B1 | 8/2017 | Kwag et al. |
| 9,818,788 B2 | 11/2017 | Sze et al. |
| 9,842,875 B2 | 12/2017 | Fan et al. |
| 9,929,194 B2 | 3/2018 | Yang et al. |
| 9,978,785 B2 | 5/2018 | Kwag et al. |
| 9,978,787 B1 | 5/2018 | Park |
| 9,992,437 B1 | 6/2018 | Keung et al. |
| 10,002,968 B2 | 6/2018 | Yoneda |
| 10,003,759 B2 | 6/2018 | Fan |
| 10,008,526 B2 | 6/2018 | Park et al. |
| 10,068,937 B2 | 9/2018 | Yang et al. |
| 10,403,673 B2 | 9/2019 | Lee et al. |
| 10,462,402 B2 | 10/2019 | Fan |
| 10,490,596 B2 | 11/2019 | Tsai |
| 10,566,375 B2 | 2/2020 | Madurawe et al. |
| 10,600,828 B2 | 3/2020 | Kudoh |
| 10,672,824 B2 | 6/2020 | Tsai |
| 10,854,668 B2 | 12/2020 | Tsai |
| 10,937,820 B2 | 3/2021 | Kudoh |
| 11,133,396 B2 | 9/2021 | Fuzuzaki |
| 2013/0069149 A1 | 3/2013 | Masuoka et al. |
| 2016/0150168 A1* | 5/2016 | Oh .................. H01L 27/14645 257/225 |
| 2018/0288348 A1* | 10/2018 | Saruwatari ........ H01L 27/14689 |
| 2020/0020728 A1 | 1/2020 | Ammo et al. |
| 2021/0043748 A1 | 2/2021 | Fukuzaki |
| 2021/0391366 A1 | 12/2021 | Fukasaku et al. |

FOREIGN PATENT DOCUMENTS

| | | |
|---|---|---|
| KR | 10-2009-0113606 | 11/2009 |
| WO | 2020-002508 | 1/2020 |
| WO | 2020-010981 | 1/2020 |
| WO | 2020-183937 | 9/2020 |
| WO | 2020-189534 | 9/2020 |
| WO | 2020-262502 | 12/2020 |
| WO | 2021-033556 | 2/2021 |
| WO | 2020-075583 | 9/2021 |

OTHER PUBLICATIONS

Partial Search Report issued in corresponding EP Patent Application No. 22170223.6 on Oct. 24, 2022.

\* cited by examiner

IMAGE SENSOR INCLUDING A TRANSISTOR WITH A VERTICAL CHANNEL AND A METHOD OF MANUFACTURING THE SAME

CROSS-REFERENCE TO RELATED APPLICATIONS

This application claims priority under 35 U.S.C. § 119 to Korean Patent Application Nos. 10-2021-0070967, filed on Jun. 1, 2021, and 10-2021-0108178, filed on Aug. 17, 2021, in the Korean Intellectual Property Office, the disclosures of which are incorporated by reference herein in their entireties.

TECHNICAL FIELD

The inventive concept relates to an image sensor, and more particularly, to an image sensor including a transistor having a vertical channel and a method of manufacturing the same.

DISCUSSION OF RELATED ART

An image sensor converts an optical image into an electrical signal. In other words, an image sensor detects and conveys information used to make an image. The two main types of digital image sensors are the charged-coupled device (CCD) and the active-pixel sensor (CMOS sensor). A variety of products such as digital cameras, camcorders, personal communication systems (PCS), game devices, security cameras, and medical micro cameras generally use CMOS sensors, which are usually cheaper and have lower power consumption than CCDs. An image sensor is configured by arranging a plurality of unit pixels in a 2-dimensional array. Generally, a unit pixel may include one photodiode and a plurality of pixel transistors. A plurality of pixel transistors constituting a unit pixel may have a 3TR structure including three transistors or a 4TR structure including four transistors. As the area of a unit pixel continues to shrink, there is limited space to arrange a plurality of pixel transistors within the unit pixel area.

SUMMARY

The inventive concept provides an image sensor capable of maximizing miniaturization of a pixel size by minimizing an arrangement area of pixel transistors and a method of manufacturing the same.

According to an embodiment of the inventive concept, there is provided an image sensor including: photodiodes arranged in a substrate; active pillars connected to the photodiodes and extending in a vertical direction perpendicular to a bottom surface of the substrate; at least two transistors stacked in the vertical direction, wherein portions of the active pillars are channel areas of the at least two transistors; a floating diffusion (FD) area disposed under a transfer transistor, which is one of the at least two transistors, wherein the FD area is configured to receive charge from the photodiode through the transfer transistor and the portions of the active pillars; and a light transmitting layer disposed on a top surface of the substrate.

According to an embodiment of the inventive concept, there is provided an image sensor including: a first semiconductor chip including photodiodes in a substrate, active pillars connected to the photodiodes and extending in a vertical direction perpendicular to a bottom surface of the substrate, a stacked structure in which conductive layers and insulation layers are alternately stacked to surround the active pillars, and a light transmitting layer disposed on a top surface of the substrate; and a second semiconductor chip coupled to a bottom surface of the first semiconductor chip and including logic elements, wherein the stacked structure comprises a stacked transistor structure in which at least two transistors using at least portions of the active pillars as a channel area are stacked.

According to an embodiment of the inventive concept, there is provided a method of manufacturing an image sensor, the method including: forming a first stacked structure comprising a plurality of insulation layers, a plurality of sacrificial layers, a first conductive layer, and a second conductive layer on a bottom surface of a substrate comprising photodiodes; forming first through holes through the first stacked structure to expose the bottom surface of the substrate; forming active pillars in the first through holes; forming line trenches extending in a first direction, separating the first stacked structure in a second direction perpendicular to the first direction, and exposing a bottom surface of an uppermost insulation layer of the first electrode structure; removing sacrificial layers exposed through the line trenches; filling the line trenches and portions from which the sacrificial layers are removed with a first conductive material; forming second through holes penetrating through the first stacked structure and exposing a bottom surface of the first conductive layer, which is an uppermost layer; forming floating diffusion (FD) straps by filling the second through holes with a second conductive material; and forming a second stacked structures separated from one another in the second direction by forming dividing areas by removing the first conductive material filling the line trenches and filling the portions from which the first conductive material is removed with an insulation material.

According to an embodiment of the inventive concept, there is provided an image sensor including: a first stacked structure extending in a first direction; and a second stacked structure extending in the first direction in parallel with the first stacked structure and insulated from the first stacked structure in a second direction perpendicular to the first direction, wherein each of the first stacked structure and second stacked structure include a plurality of pixels and first electrode pads formed at ends thereof in the first direction, each of the pixels includes a photodiode, an active pillar connected to the photodiode and extending in a vertical direction, and a plurality of stacked transistors using the active pillar as a channel, and the first electrode pads are coupled to at least one gate of the stacked transistors.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
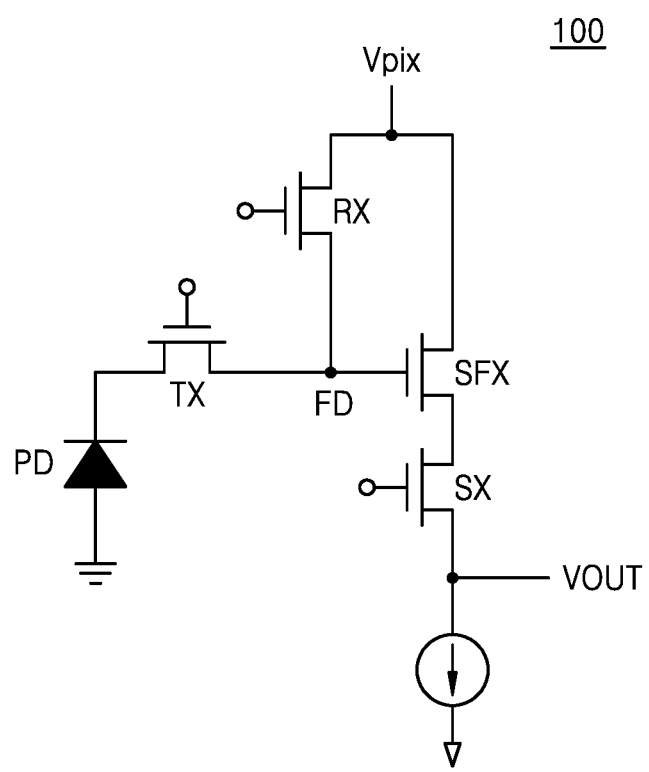
FIG. 1 is a circuit diagram of a pixel of an image sensor including a transistor having a vertical channel according to an example embodiment of the inventive concept.

FIG. 1 is a circuit diagram of a pixel of an image sensor including a transistor having a vertical channel according to an example embodiment of the inventive concept.

Referring to FIG. 1, an image sensor 100 including a transistor having a vertical channel (hereinafter, simply referred to as an image sensor) according to the present embodiment includes a plurality of pixels, and the pixels may be arranged in a 2-dimensional array structure. The pixels in such a 2-dimensional array structure may constitute an active pixel sensor (APS). The image sensor 100 according to the present embodiment may be, for example, a complementary metal-oxide-semiconductor (CMOS) image sensor (CIS). However, the image sensor 100 according to the present embodiment is not limited to a CIS.

FIG. 1 shows one arbitrary unit pixel from among the pixels, and the one unit pixel may include a photodiode PD, a floating diffusion (FD) area FD, and pixel transistors. The pixel transistors may include, for example, a transfer transistor TX, a reset transistor RX, a source follower transistor SFX, and a selection transistor SX. In the image sensor 100 according to the present embodiment, the FD area FD and the pixel transistors are formed on the front surface (refer to FS of FIG. 2C) of a substrate (refer to 101 of FIG. 2C) and may also be arranged below the photodiode PD. Here, the front surface FS of the substrate 101 may correspond to the bottom surface of the substrate 101. The front surface FS and the back surface (refer to BS of FIG. 2C) of the substrate 101 are described below in more detail with reference to FIGS. 2A to 2C. Because a signal is output from the photodiode PD by using four transistors, the image sensor 100 according to the present embodiment may be an image sensor having a 4TR structure.

The photodiode PD may generate and accumulate electric charges in proportion to an amount of external light incident thereto. For reference, an element that converts light into an electric charge is generally referred to as a photoelectric conversion element, and the photodiode PD may correspond to a type of photoelectric conversion element. However, in the image sensor 100 according to the present embodiment, photoelectric conversion elements arranged in pixels are not limited to photodiodes PD. For example, other types of photoelectric conversion elements such as a phototransistor, a photogate, a pinned-photodiode, and a combination thereof may be disposed in pixels according to embodiments of the inventive concept.

In the image sensor 100 according to the present embodiment, the pixel transistors are arranged on the front surface FS of the substrate 101 in a vertical direction, and the pixel transistors may include a vertical channel. For example, an active pillar (refer to 150 of FIG. 2B) extending in a vertical direction from the front surface FS of the substrate 101 is formed on the front surface FS of the substrate 101, and the active pillar 150 may be used as the vertical channel of the pixel transistors. Pixel transistors including a vertical channel are described below in more detail with reference to FIGS. 2A to 2C.

The FD area FD may receive and cumulatively store charges generated by the photodiode PD. The source follower transistor SFX may be controlled according to an amount of charges accumulated in the FD area FD. This is so, because the gate of the source follower transistor SFX is connected to the FD area FD. The reset transistor RX may periodically reset charges accumulated in the FD area FD. A drain of the reset transistor RX may be connected to the FD area FD, and a source of the reset transistor RX may be connected to a power voltage Vpix. When the reset transistor RX is turned on, the power voltage Vpix connected to the source of the reset transistor RX may be applied to the FD area FD. Therefore, when the reset transistor RX is turned on, charges accumulated in the FD area FD may be discharged, and thus the FD area FD may be reset.

The source follower transistor SFX may correspond to a source follower buffer amplifier. In other words, the source follower transistor SFX may amplify a potential change according to an amount of charge in the FD area FD and output the power voltage Vpix corresponding to the amplified potential change to an output line Vout through the selection transistor SX. The selection transistor SX may select pixels to be read row-by-row. When the selection transistor SX is turned on, the power voltage Vpix applied to a source electrode of the source follower transistor SFX may be output through the source follower transistor SFX and the selection transistor SX.

Figure 2A:
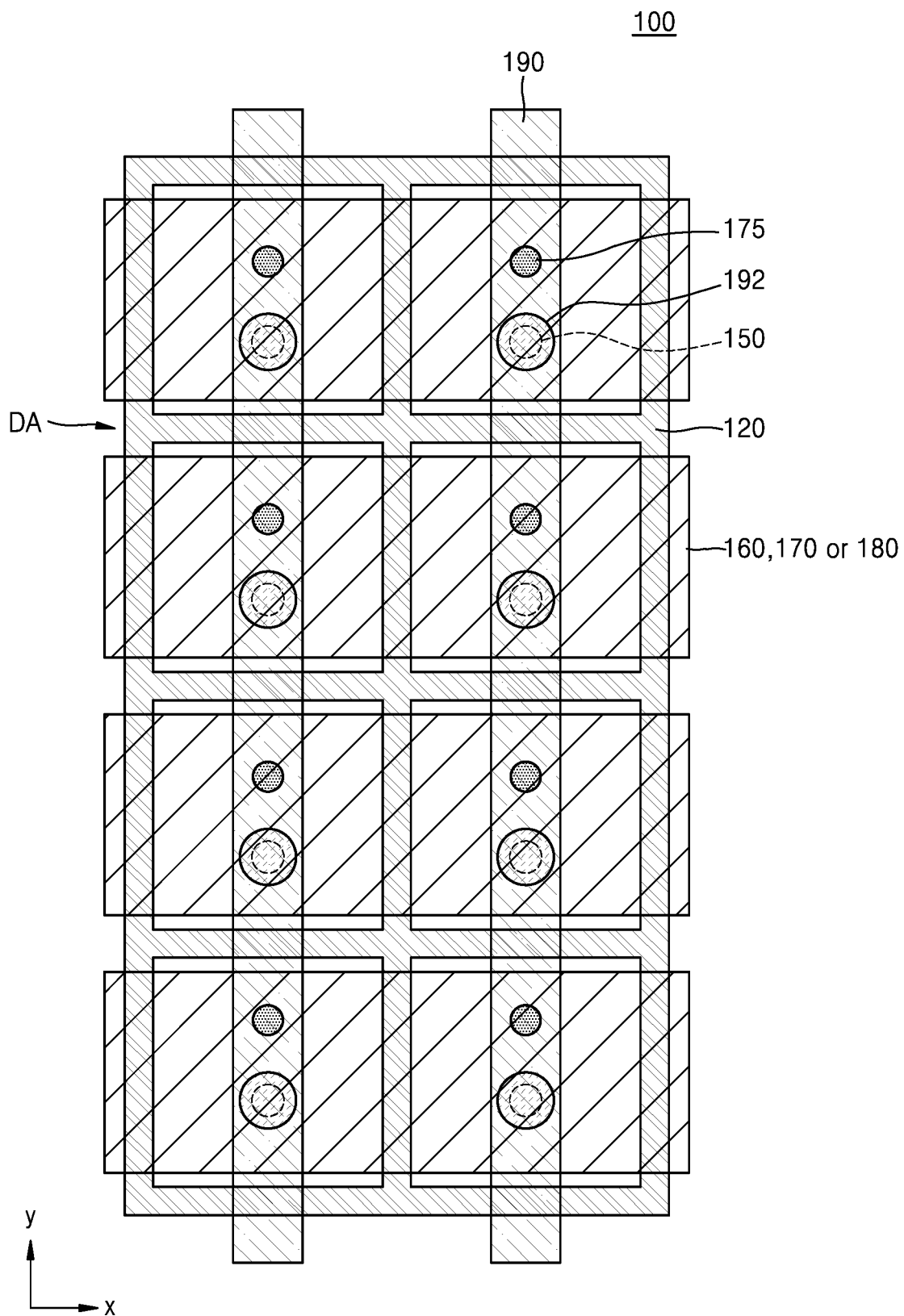
FIGS. 2A, 2B and 2C are a plan view, an enlarged view, and a cross-sectional view of pixels of an image sensor including a transistor having a vertical channel according to an example embodiment of the inventive concept.
Figure 2B:
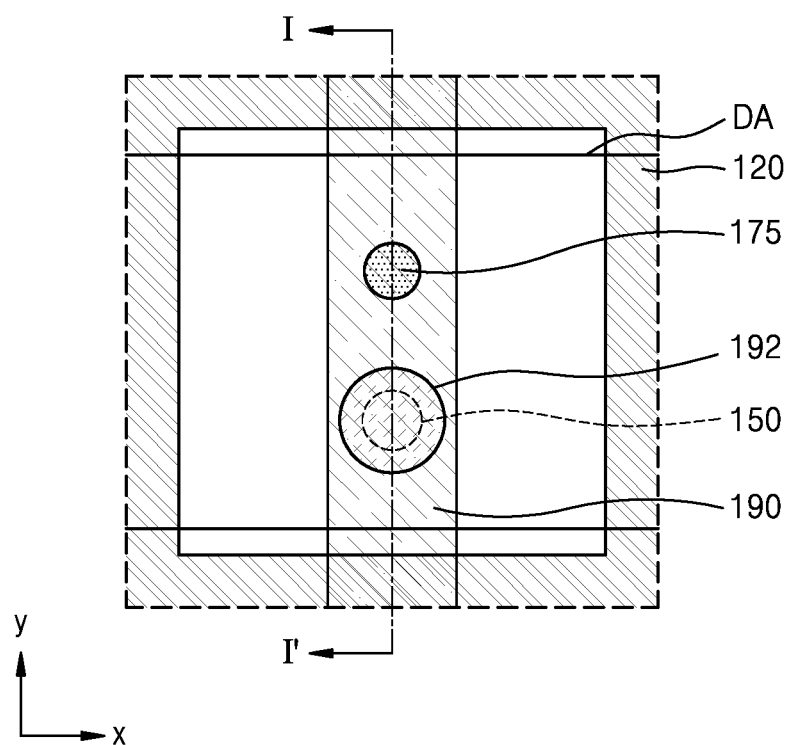
Figure 2C:
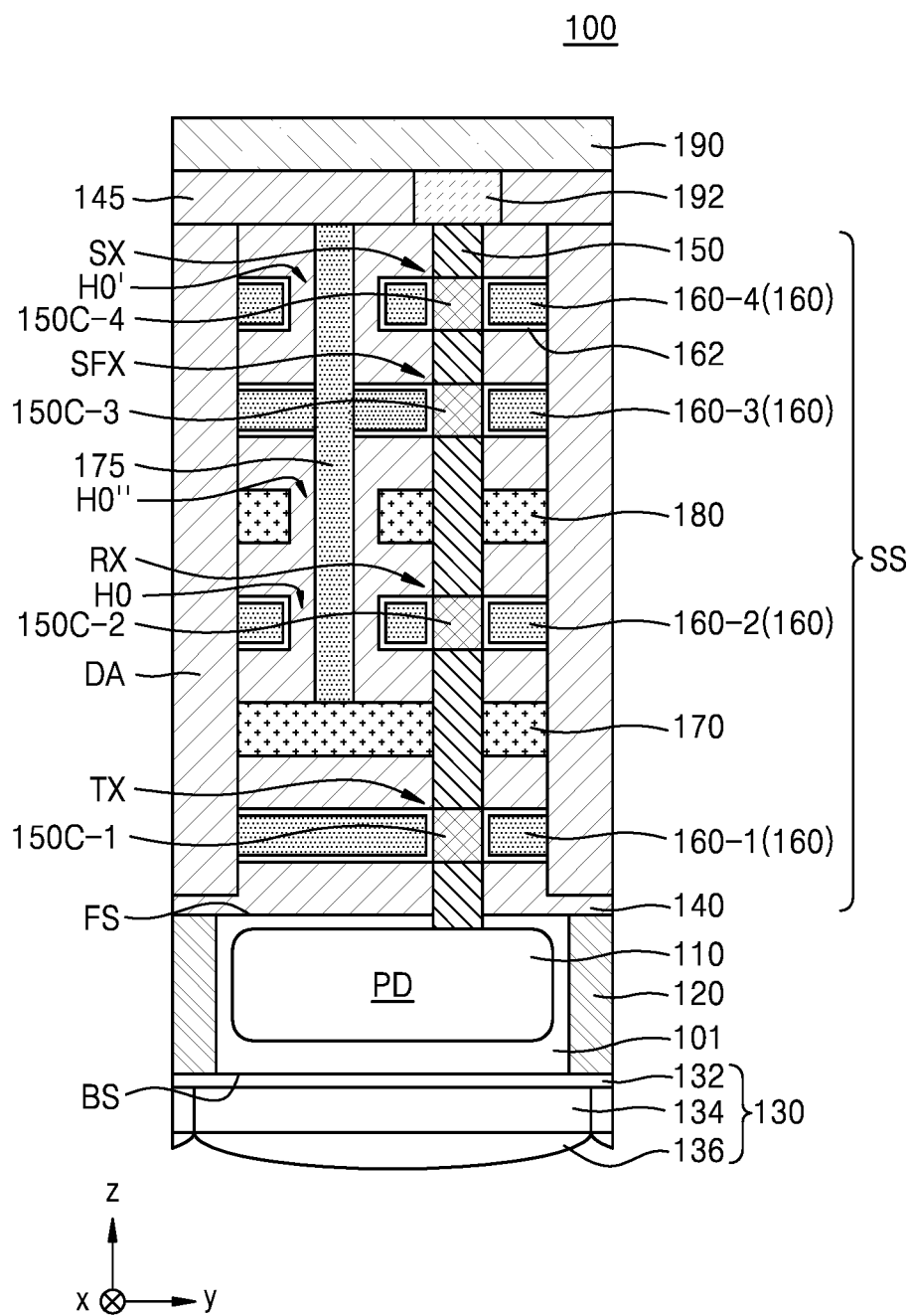

FIGS. 2A to 2C are a plan view, an enlarged view, and a cross-sectional view of pixels of an image sensor according to an example embodiment of the inventive concept, wherein FIG. 2B is an enlarged view of one of the pixels of FIG. 2A, and FIG. 2C is a cross-sectional view taken along a line I-I' of FIG. 2B.

Referring to FIGS. 2A to 2C, the image sensor 100 according to the present embodiment may include the substrate 101, a photodiode 110, a pixel isolation structure 120, a light transmitting layer 130, a stacked structure SS, and an output line layer 190.

The substrate 101 may include a front surface FS and a back surface BS opposite to the front surface FS. The stacked structure SS may be disposed on the front surface FS of the substrate 101, and the light transmitting layer 130 may be disposed on the back surface BS of the substrate 101.

Figure 7A:
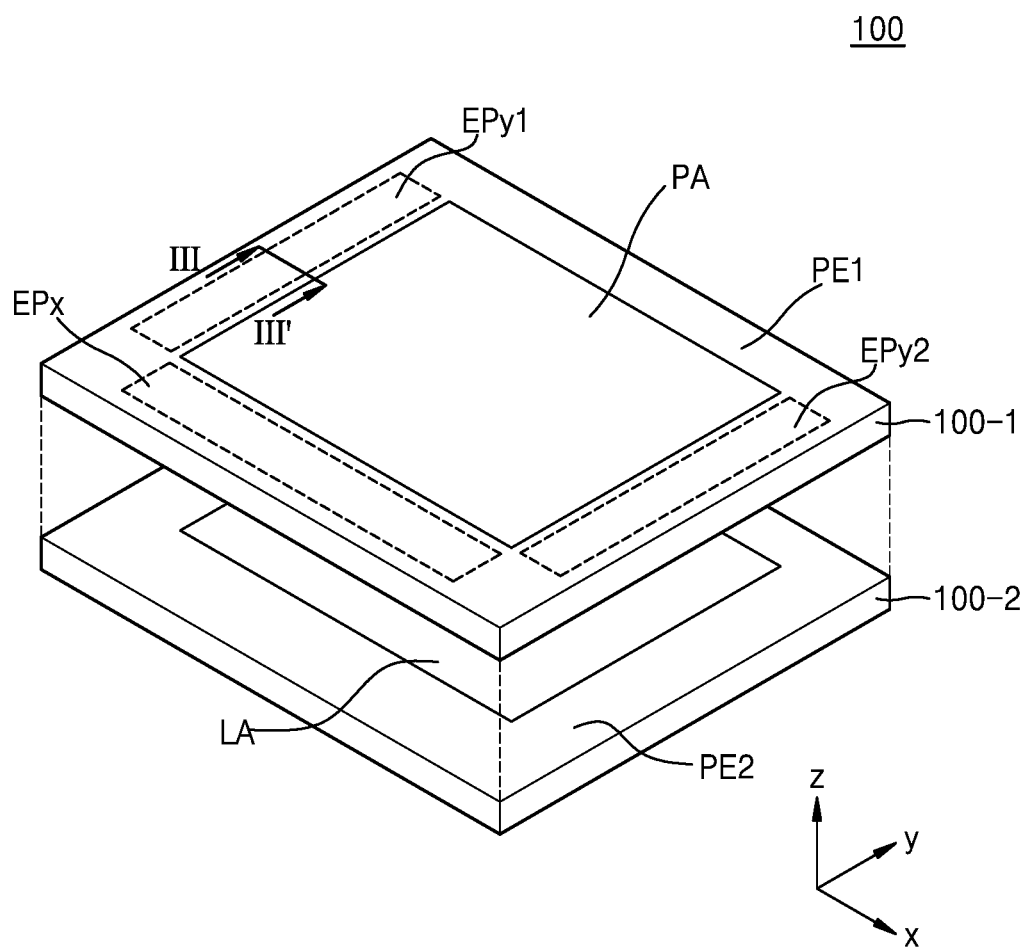
FIGS. 7A, 7B and 7C show a stacked structure of an image sensor including transistors having a vertical channel according to an example embodiment of the inventive concept and, more particularly, are an exploded perspective view of a state in which a first semiconductor chip and a second semiconductor chip are separated, a partial cross-sectional view, and a perspective view of a structure in which three semiconductor chips are stacked.

Here, considering the stacked structure of the image sensor 100 of FIG. 7A, the substrate 101 may correspond to a substrate of a first semiconductor chip 100-1, and the front surface FS of the substrate 101 may correspond to the bottom surface of the substrate 101. In addition, the back surface BS of the substrate 101 may correspond to the top surface of the substrate 101. In other words, when light is incident on the image sensor 100 from above in a third direction (z-direction), the light may incident on the photodiode 110 through the back surface BS of the substrate 101, in other words, the top surface of the substrate 101.

Here, the image sensor 100 according to the present embodiment may include the first semiconductor chip 100-1 and a second semiconductor chip 100-2, as shown in FIG. 7A. However, for convenience of explanation, in most cross-sectional views including FIG. 2C, the second semiconductor chip 100-2 is omitted and only the first semiconductor chip 100-1 is shown upside down. In addition, in the detailed description, the bottom surface, a lower portion, the top surface, and an upper portion of the first semiconductor chip 100-1 are described based on the shape of the first semiconductor chip 100-1 that is upside down. Therefore, in the descriptions of the drawings other than the descriptions of FIGS. 7A, 7B, 9A, and 9B showing the stacked structure, the bottom surface, the lower portion, the top surface, and the upper portion may correspond to the top surface, the upper portion, the bottom surface, and the lower portion of the first semiconductor chip 100-1 in the image sensor 100 of FIG. 7A.

The substrate 101 may be a substrate in which an epitaxial layer of a first conductivity type (e.g., p-type) is formed on a bulk silicon substrate of the first conductivity type. In addition, according to embodiments of the inventive concept, the bulk silicon substrate may be removed from the substrate 101 and only the epitaxial layer may remain. In addition, the substrate 101 may be a bulk silicon substrate including wells of the first conductivity type. Alternatively, the substrate 101 may include various types of substrates like a substrate including an epitaxial layer of a second conductivity type (e.g., n-type) and a silicon-on-insulator (SOI) substrate.

The substrate 101 may include a plurality of pixels defined by the pixel isolation structure 120. One pixel defined by the pixel isolation structure 120 is shown in FIG. 2B. As described above, the pixels may be arranged in a 2-dimensional array structure and constitute an APS.

As described above, the photodiode 110 may generate and accumulate charges in proportion to the intensity of light incident through the back surface BS of the substrate 101, in other words, an amount of the incident light. The photodiode 110 may include, for example, a first impurity area doped with an impurity of a first conductivity type (e.g., p-type) and a second impurity area doped with an impurity of a second conductivity type (e.g., n-type). The first impurity area and the second impurity area may constitute a p-n junction. According to some embodiments of the inventive concept, the substrate 101 may serve as the first impurity area. In such a case, the substrate 101 and the second impurity area may constitute the photodiode 110 without a separate first impurity area. The photodiode 110 may be disposed inside the substrate 101 at the center portion of each of the pixels.

The pixels may be arranged in a 2-dimensional array structure and constitute an APS. The pixel isolation structure 120 may prevent charges generated when light is incident on a particular pixel from entering an adjacent pixel. In other words, the pixel isolation structure 120 may prevent crosstalk between adjacent pixels. When viewed from above, the pixel isolation structure 120 has a lattice-like shape and may completely surround each of the pixels. In addition, as shown in FIG. 2C, the pixel isolation structure 120 may extend through the substrate 101.

In addition, the pixel isolation structure 120 may have a structure including a conductive layer and an insulation layer. The conductive layer may be disposed at the center portion of the pixel isolation structure 120, and the insulation layer may be disposed at the outer portion of the pixel isolation structure 120 in a shape surrounding the conductive layer. A ground voltage or a negative voltage may be applied to the conductive layer. By applying a ground voltage or a negative voltage to the conductive layer, positive charges generated by pixels may be removed through the conductive layer. As a result, the dark current characteristic of the image sensor 100 may be enhanced through the conductive layer of the pixel isolation structure 120. According to some embodiments of the inventive concept, a buried layer may be disposed inside the conductive layer. The buried layer may be used to prevent formation of voids in the pixel isolation structure 120 and prevent warpage of the substrate 101 by offsetting tensile stress applied to the substrate 101 during a high-temperature process.

In addition, the pixel isolation structure 120 may be formed by forming a deep trench in the substrate 101 and filling the trench with an insulation material and a conductive material. Therefore, the pixel isolation structure 120 is also referred to as a deep trench isolation (DTI) structure. In addition, the pixel isolation structure 120 may be classified as an FDTI (Front DTI) structure or a BDTI (Back DTI) structure depending on whether the trench is formed in the front surface FS or the back surface BS of the substrate 101. In addition, the pixel isolation structure 120 may have various shapes depending on the shape of the trench.

The light transmitting layer 130 may include a transparent insulation layer 132, a color filter 134, and a micro lens 136. The transparent insulation layer 132 may include at least two insulation layers and may include an anti-reflection layer. Light may be incident on the photodiode 110 through the light transmitting layer 130 on the back surface BS of the substrate 101. Generally, in an image sensor, a structure in which a wiring layer and a light transmitting layer are arranged on opposite surfaces of the substrate 101, e.g., a structure in which a wiring layer is disposed on the front surface FS of the substrate 101 and a light transmitting layer is disposed on the back surface BS of the substrate 101, is referred to as a back side illumination (BSI) structure. In the alternative, a structure in which a wiring layer and a light transmitting layer are arranged together on the same surface of the substrate 101, e.g., the front surface FS of the substrate 101, is referred to as a front side illumination (FSI) structure. When the stacked structure SS corresponds to a wiring layer, the image sensor 100 according to the present embodiment may correspond to the BSI structure.

The stacked structure SS is disposed on the front surface FS of the substrate 101 and may include an interlayer insulation layer 140, an active pillar 150, a gate line unit 160, an FD area 170, and a power line layer 180. The interlayer insulation layer 140 may insulate conductive layers from each other in a direction perpendicular to the front surface FS of the substrate 101 (e.g., the third direction (z direction)). The interlayer insulation layer 140 may include, for example, silicon oxide, silicon nitride, silicon oxynitride, etc. However, in a method of manufacturing an image sensor described below, the interlayer insulation layer 140 may include a material having a different etch selectivity from that of a sacrificial layer (refer to 167 of FIG. 10B).

The active pillar 150 may have a structure extending from the front surface FS of the substrate 101 in the vertical direction (e.g., the third direction (z direction)) and penetrating through the stacked structure SS. The active pillar 150 may have a lower end connected to the photodiode 110 and an upper end connected to the output line layer 190 through a contact 192. The lower end of the active pillar 150 may be directly connected to the photodiode 110. The active pillar 150 may include monocrystalline silicon. For example, the active pillar 150 may be formed by transiting amorphous silicon to monocrystalline silicon through heat treatment or laser epitaxial growth (LEG). In addition, the active pillar 150 may be formed through LEG or a solid phase transition epitaxy (SPE) process by using the substrate 101 as a seed. However, the material constituting the active pillar 150 is not limited to monocrystalline silicon.

In addition, the active pillar 150 may have various pillar shapes, e.g., a cylinder, an elliptical pillar, and a polygonal pillar. However, the shape of the active pillar 150 is not limited to the above-described pillar shape. For example, the active pillar 150 may have a cylindrical shape or a macaroni-like shape having a bottom surface and side surfaces and an empty center portion. When the active pillar 150 has a macaroni-like shape, the interior of the active pillar 150 may be filled with a buried insulation layer.

The gate line unit 160 may include first to fourth gate line layers 160-1 to 160-4, as shown in FIG. 2C. However, the number of layers of the gate line unit 160 is not limited to four. For example, according to some embodiments of the inventive concept, the gate line unit 160 may include two or three gate line layers. Embodiments thereof are described below in more detail with reference to FIGS. 3A and 3B.

The first to fourth gate line layers 160-1 to 160-4 may each have a flat plate-like shape parallel to the front surface FS of the substrate 101 and may surround the active pillar 150. In addition, the first to fourth gate line layers 160-1 to 160-4 may each extend in a first direction (x direction) and may be separated from one another by a dividing area DA in a second direction (y direction). Therefore, the first to fourth gate line layers 160-1 to 160-4 may have substantially the same width in the second direction (y direction). As shown in FIG. 2C, the first to fourth gate line layers 160-1 to 160-4 may each be surrounded by an insulation layer 162. A portion of the insulation layer 162 surrounding the active pillar 150 may correspond to a gate insulation layer. In the second direction (y direction), the first to fourth gate line layers 160-1 to 160-4 may each have a width less than that of the photodiode 110.

The first gate line layer 160-1 may be disposed lowermost in the stacked structure SS and surround a first channel area 150C-1 lowermost in the active pillar 150. The first gate line layer 160-1 may constitute a transfer transistor TX together with the first channel area 150C-1. For example, a portion of active pillars 150 on both sides of the first channel area 150C-1 in the third direction (z direction) may constitute a source/drain area. Considering the functional aspect of a transistor, the photodiode 110 and a portion of the active pillar 150 connected thereto may correspond to a source area, and the FD area 170 and a portion of the active pillar 150 connected thereto may correspond to a drain area. In addition, a portion of the first gate line layer 160-1 surrounding the first channel area 150C-1 may constitute a gate of the transfer transistor TX. The gate of the transfer transistor TX surrounds the first channel area 150C-1 in a gate all around (GAA) structure, and the insulation layer 162 may be disposed between the first channel area 150C-1 and the gate of the transfer transistor TX.

The second gate line layer 160-2 may be disposed second lowermost in the stacked structure SS and surround a second channel area 150C-2 second lowermost in the active pillar 150. The second gate line layer 160-2 may constitute a reset transistor RX together with the second channel area 150C-2. For example, a portion of active pillars 150 on both sides of the second channel area 150C-2 in the third direction (z direction) may constitute a source/drain area. In addition, a portion of the second gate line layer 160-2 surrounding the second channel area 150C-2 may constitute a gate of the reset transistor RX. The gate of the reset transistor RX surrounds the second channel area 150C-2 in a GAA structure, and the insulation layer 162 may be disposed between the second channel area 150C-2 and the gate of the reset transistor RX.

In addition, the second gate line layer 160-2 may include an open hole H0. An FD strap 175 may pass through the open hole H0. As shown in FIG. 2C, the FD strap 175 and the second gate line layer 160-2 may be horizontally spaced apart from each other by the open hole H0. Therefore, the FD strap 175 and the second gate line layer 160-2 may not be electrically connected to each other.

The third gate line layer 160-3 may be disposed third lowermost in the stacked structure SS and surround a third channel area 150C-3 third lowermost in the active pillar 150. The third gate line layer 160-3 may constitute the source follower transistor SFX together with the third channel area 150C-3. For example, a portion of active pillars 150 on both sides of the third channel area 150C-3 in the third direction (z direction) may constitute a source/drain area. In addition, a portion of the third gate line layer 160-3 surrounding the third channel area 150C-3 may constitute a gate of the source follower transistor SFX. The gate of the source follower transistor SFX surrounds the third channel area 150C-3 in a GAA structure, and the insulation layer 162 may be disposed between the third channel area 150C-3 and the gate of the source follower transistor SFX. As shown in FIG. 2C, the FD strap 175 and the third gate line layer 160-3 may be connected to each other. For example, the FD strap 175 and the third gate line layer 160-3 may directly contact each other. Accordingly, the gate of the source follower transistor SFX may be connected to the FD area 170 through the FD strap 175.

The fourth gate line layer 160-4 may be disposed fourth lowermost in the stacked structure SS or uppermost in the stacked structure SS and surround the fourth channel area 150C-4 fourth lowermost in the active pillar 150 or uppermost in the active pillar 150. The fourth gate line layer 160-4 may constitute the selection transistor SX together with the fourth channel area 150C-4. For example, a portion of active pillars 150 on both sides of the fourth channel area 150C-4 in the third direction (z direction) may constitute a source/drain area. In addition, a portion of the fourth gate line layer 160-4 surrounding the fourth channel area 150C-4 may constitute a gate of the selection transistor SX. The gate of the selection transistor SX surrounds the fourth channel area 150C-4 in a GAA structure, and the insulation layer 162 may be disposed between the fourth channel area 150C-4 and the gate of the selection transistor SX.

In addition, the fourth gate line layer 160-4 may include an open hole H0'. An FD strap 175 may pass through the open hole H0'. As shown in FIG. 2C, the FD strap 175 and the fourth gate line layer 160-4 may be horizontally spaced apart from each other by the open hole H0'. Therefore, the FD strap 175 and the fourth gate line layer 160-4 may not be electrically connected to each other.

The FD area 170 has a flat plate-like shape parallel to the front surface FS of the substrate 101 and may surround the active pillar 150. The FD areas 170 extend in the first direction (x direction) and may be separated from each other by the dividing area DA in the second direction (y direction). The FD area 170 may include a conductive material, e.g., polysilicon. However, the material constituting the FD area 170 is not limited to polysilicon. As shown in FIG. 2C, the FD area 170 may directly contact and be connected to the active pillar 150, unlike the gate line unit 160 which is separated from the active pillar 150 by the insulation layer 162. Therefore, charges generated by the photodiode 110 may be transferred to the FD area 170 through the transfer transistor TX and the active pillar 150 and accumulated therein.

The FD strap 175 may extend from the front surface FS of the substrate 101 in the vertical direction (e.g., the third direction (z direction)) and penetrate through the stacked structure SS. A lower end of the FD strap 175 may be connected to the FD area 170. For example, the lower end of the FD strap 175 may be directly connected to the FD area 170. An upper portion of the FD strap 175 may be connected to the third gate line layer 160-3. For example, the upper portion of the FD strap 175 may be directly connected to the third gate line layer 160-3. Because the third gate line layer 160-3 directly surrounds the FD strap 175, the FD strap 175 may be connected to the third gate line layer 160-3. Therefore, the FD strap 175 may be connected to the gate of the source follower transistor SFX through the third gate line layer 160-3.

The position of the upper end of the FD strap 175 is not limited thereto. For example, as long as the FD strap 175 is connected to the third gate line layer 160-3, unlike as in FIG. 2C, the upper end of the FD strap 175 may be lower than the fourth gate line layer 160-4. According to some embodiments of the inventive concept, the FD strap 175 may be connected to the FD strap 175 of another adjacent pixel through a connection wire on the upper portion of the stacked structure SS. Through the connection of FD straps 175, adjacent pixels may share FD areas 170, and the capacitor capacity of the FD area 175 may be adjusted according to operating conditions.

In addition, the FD strap 175 may have various pillar shapes, e.g., a cylinder, an elliptical pillar, and a polygonal pillar. However, the shape of the FD strap 175 is not limited to the above-described pillar shape. For example, the FD strap 175 may have a cylindrical shape or a macaroni-like shape having a bottom surface and side surfaces and an empty center portion. The FD strap 175 may include a conductive material, e.g., polysilicon. However, the material constituting the FD area 170 is not limited to polysilicon. For example, the FD strap 175 may include a metal, a metal silicide, a metal-containing conductive material, etc.

The power line layer 180 has a flat plate-like shape parallel to the front surface FS of the substrate 101 and may surround the active pillar 150. The power line layers 180 extend in the first direction (x direction) and may be separated from each other by the dividing area DA in the second direction (y direction). Therefore, the power line layer 180 may have substantially the same width as that of the gate line unit 160 in the second direction (y direction). The power line layer 180 may include a conductive material, e.g., polysilicon. However, the material constituting the power line layer 180 is not limited to polysilicon. As shown in FIG. 2C, the power line layer 180 may directly contact and be connected to the active pillar 150 like the FD area 170. Therefore, the power voltage Vpix may be applied to the active pillar 150 through the power line layer 180. In addition, the power voltage Vpix may be applied to source areas of the reset transistor RX and the source follower transistor SFX through the active pillar 150.

The power line layer 180 may include an open hole H0". The FD strap 175 may pass through the open hole H0". As shown in FIG. 2C, the FD strap 175 and the power line layer 180 may be horizontally spaced apart from each other by the open hole H0". Therefore, the FD strap 175 and the power line layer 180 may not be electrically connected to each other.

The output line layer 190 may be disposed on the stacked structure SS and extend in the second direction (y direction). As shown in FIG. 2C, an upper insulation layer 145 and the contact 192 may be arranged on the stacked structure SS. In addition, the contact 192 may have a structure penetrating through the upper insulation layer 145, may be disposed on the top surface of the active pillar 150, and may be connected to the output line layer 190. Therefore, the active pillar 150 may be connected to the output line layer 190 through the contact 192. For example, the output line layer 190 may be connected to a source area of the selection transistor SX through the contact 192. Therefore, when the selection transistor SX is turned on, the power voltage Vpix applied to a drain electrode of the source follower transistor SFX may be output to the output line layer 190 through the source follower transistor SFX and the selection transistor SX.

According to some embodiments of the inventive concept, the output line layer 190 may not be disposed on the first semiconductor chip (refer to 100-1 of FIG. 7) and may be disposed on the second semiconductor chip (refer to 100-2 of FIG. 7). In such a structure, the contact 192 on the stacked structure SS may be directly connected to an output line layer (refer to 190a of FIG. 9B) on the second semiconductor chip 100-2. The arrangement of an output line layer is described below in more detail with reference to FIGS. 9A and 9B.

The image sensor 100 according to the present embodiment may include the active pillar 150 extending in a direction perpendicular to the front surface FS of the substrate 101 and four gate line layers, in other words, the first to fourth gate line layers 160-1 to 160-4, vertically stacked to surround the active pillar 150. In addition, the fourth gate line layers, in other words, the first to fourth gate line layers 160-1 to 160-4, may successively configure four transistors, in other words, a transfer transistor, a reset transistor, a source follower transistor, and a selection transistor, by using the active pillar 150 as a channel area. As a result, in the image sensor 100 according to the present embodiment, pixel transistors having a vertical channel are arranged over the photodiode 110, and thus, the arrangement area of the pixel transistors is minimized when viewed from above and the size reduction of pixels may be maximized.

Figure 3A:
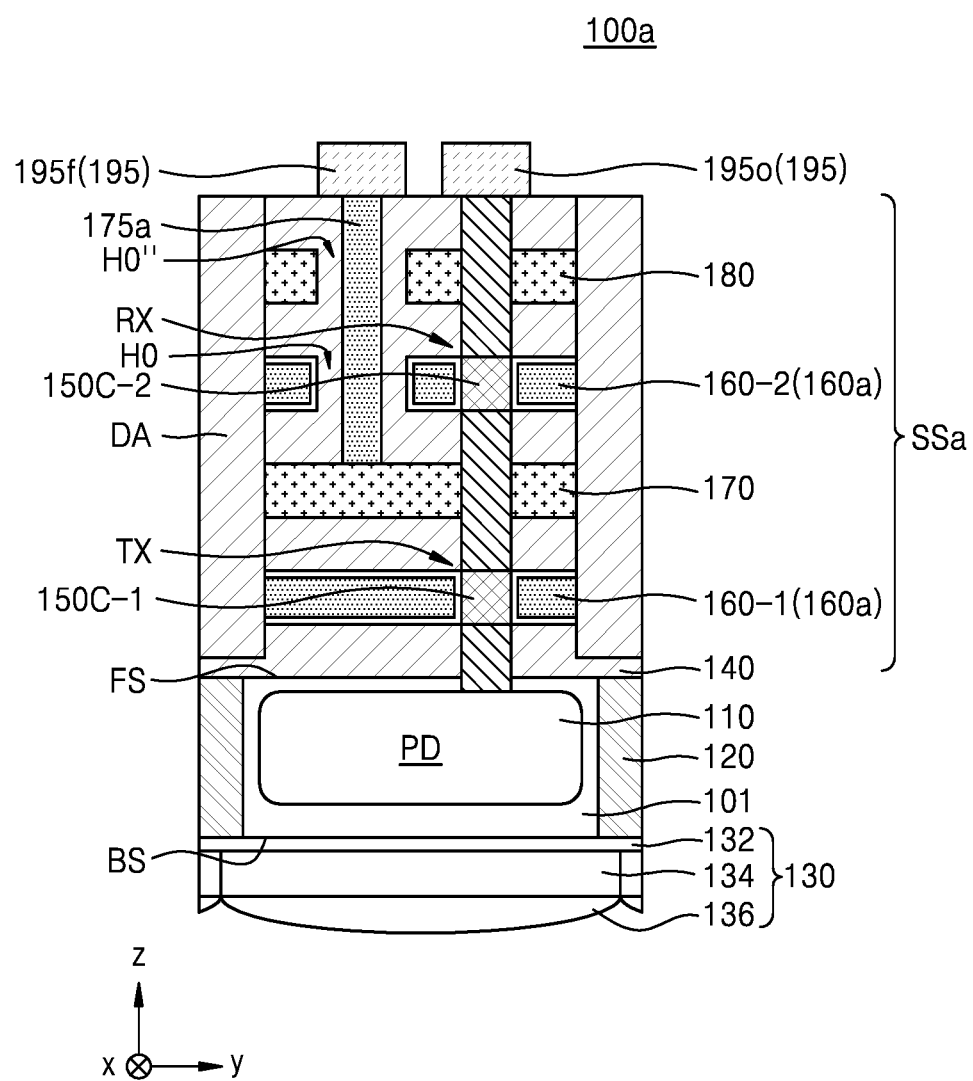
FIGS. 3A and 3B are cross-sectional views of a pixel of an image sensor including a transistor having a vertical channel according to example embodiments of the inventive concept.
Figure 3B:
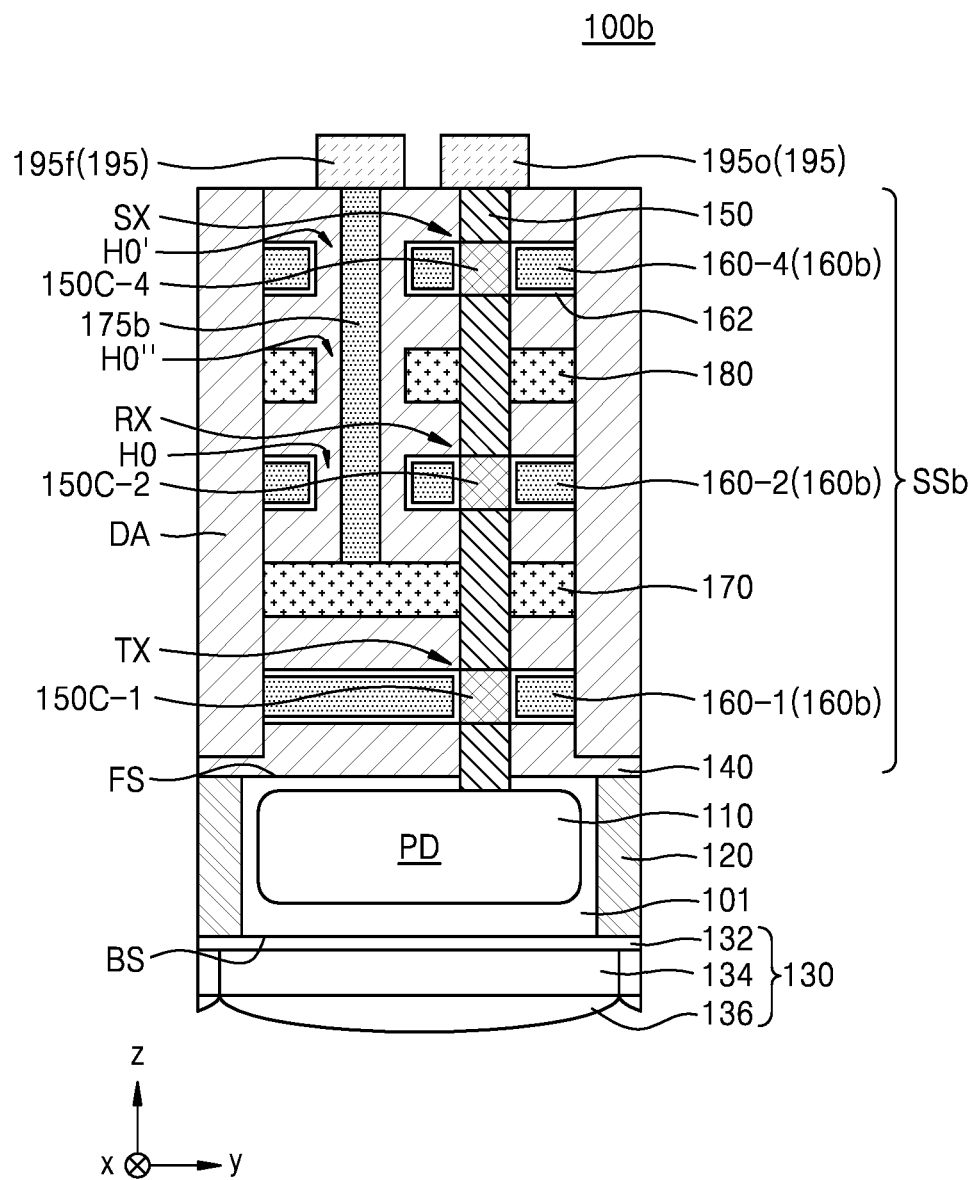

FIGS. 3A and 3B are cross-sectional views of a pixel of an image sensor according to example embodiments of the inventive concept, which may correspond to FIG. 2C.

Referring to FIG. 3A, an image sensor 100a according to the present embodiment may be different from the image sensor 100 of FIG. 2C in the structure of a stacked structure SSa. For example, in the image sensor 100a according to the present embodiment, the stacked structure SSa may include the interlayer insulation layer 140, the active pillar 150, a gate line unit 160a, the FD area 170, and the power line layer 180. The interlayer insulation layer 140, the active pillar 150, the FD area 170, and the power line layer 180 are the same as those described above with reference to FIGS. 2A to 2C.

In the image sensor 100a according to the present embodiment, the gate line unit 160a may include only the first gate line layer 160-1 and the second gate line layer 160-2. In other words, the gate line unit 160a may not include the third gate line layer 160-3 and the fourth gate line layer 160-4 of FIG. 2C. As described above for the first gate line layer 160-1 and the second gate line layer 160-2 of the image sensor 100 of FIG. 2C, the first gate line layer 160-1 constitutes the transfer transistor TX together with the first channel area 150C-1, and the second gate line layer 160-2 constitutes the reset transistor RX together with the second channel area 150C-2.

In the case of an FD strap 175a, because the source follower transistor SFX is not disposed in a first semiconductor chip (refer to 100-1 of FIG. 7A), in the first semiconductor chip 100-1, the FD strap 175a may be connected to a first electrode pad 195f disposed on the stacked structure SSa instead of being connected to the gate of the source follower transistor SFX. In addition, the active pillar 150 may also be connected to a first electrode pad 195o disposed on the stacked structure SSa.

In addition, a second semiconductor chip (100-2 of FIG. 7A) may include the source follower transistor SFX and the selection transistor SX. For example, the source follower transistor SFX and the selection transistor SX may each be formed on a substrate (refer to 102 of FIG. 7B) of the second semiconductor chip 100-2 in a transistor structure including a horizontal channel instead of a vertical channel. The source follower transistor SFX and the selection transistor SX may be connected to a first electrode pad 195 of a corresponding pixel of the first semiconductor chip 100-1 through second electrode pads (refer to 106 of FIG. 7B) formed in a wiring layer (refer to 104 of FIG. 7B) disposed over a logic area LA of the second semiconductor chip 100-2. For example, the gate of the source follower transistor SFX may be connected to the FD strap 175a through the first electrode pad 195f and the second electrode pad 106, thereby being connected to the FD area 170. In addition, a source of the source follower transistor SFX may be connected to the active pillar 150 through the first electrode pad 195o and a second electrode pad 106 (refer to FIG. 7B), thereby being connected to the power line layer 180.

Here, in the image sensor 100a according to the present embodiment, the first semiconductor chip 100-1 and the second semiconductor chip 100-2 may be coupled to each other through Cu-to-Cu bonding. Therefore, the first electrode pad 195 and the second electrode pad 106 may each include Cu. In addition, in the image sensor 100a according to the present embodiment, an output line layer may be disposed on the second semiconductor chip 100-2 and may be connected to a source area of the selection transistor SX.

In addition, according to some embodiments, the image sensor 100a according to the present embodiment may further include a third semiconductor chip. For example, the structure shown in FIG. 3A may be formed in the first semiconductor chip 100-1, the source follower transistor SFX, the selection transistor SX, and an output line layer may be formed in the third semiconductor chip (refer to 100-3 of FIG. 7C), and an analog-to-digital converter (ADC) and logic elements may be formed in the second semiconductor chip 100-2. In addition, the image sensor 100a having such a structure may have a structure in which the first semiconductor chip 100-1, the third semiconductor chip 100-3, and the second semiconductor chip 100-2 are stacked in the order stated from top to bottom. The ADC may be disposed in the third semiconductor chip 100-3 instead of the second semiconductor chip 100-2.

Referring to FIG. 3B, an image sensor 100b according to the present embodiment may be different from the image sensor 100 of FIG. 2C in the structure of a stacked structure SSb. For example, in the image sensor 100b according to the present embodiment, the stacked structure SSb may include the interlayer insulation layer 140, the active pillar 150, a gate line unit 160b, the FD area 170, and the power line layer 180. The interlayer insulation layer 140, the active pillar 150, the FD area 170, and the power line layer 180 are the same as those described above with reference to FIGS. 2A to 2C.

In the image sensor 100b according to the present embodiment, the gate line unit 160b may include only the first gate line layer 160-1, the second gate line layer 160-2, and the fourth gate line layer 160-4. In other words, the gate line unit 160b may not include the third gate line layer 160-3 of FIG. 2C. As described above for the first gate line layer 160-1, the second gate line layer 160-2, and the fourth gate line layer 160-4 of FIG. 2C, the first gate line layer 160-1 constitutes the transfer transistor TX together with the first channel area 150C-1, the second gate line layer 160-2 constitutes the reset transistor RX together with the second channel area 150C-2, and the fourth gate line layer 160-4 constitutes the selection transistor SX together with the fourth channel area 150C-4.

In the case of an FD strap 175b, because the source follower transistor SFX is not disposed in a first semiconductor chip (refer to 100-1 of FIG. 7A), in the first semiconductor chip 100-1, the FD strap 175b may be connected to a first electrode pad 195f disposed on the stacked structure SSb instead of being connected to the gate of the source follower transistor SFX. In other words, the FD strap 175b may be directly connected to the first electrode pad 195f. In addition, the active pillar 150 may also be connected to a first electrode pad 195o disposed on the stacked structure SSb. For example, the active pillar 150 may be directly connected to the first electrode pad 195o.

In addition, the second semiconductor chip 100-2 may include the source follower transistor SFX. For example, the source follower transistor SFX may be formed in a transistor structure including a horizontal channel instead of a vertical channel on a substrate 102 of the second semiconductor chip 100-2. The source follower transistor SFX may be connected to the second electrode pad 106 formed on the top surface of the second semiconductor chip 100-2 through a wiring layer 104 of the second semiconductor chip 100-2, and the electrode pad 106 may be connected to a corresponding first electrode pad 195 of the first semiconductor chip 100-1. For example, the gate of the source follower transistor SFX may be connected to the FD strap 175b through the first electrode pad 195f and the second electrode pad 106, thereby being connected to the FD area 170. In addition, a drain area of the source follower transistor SFX may be connected to the active pillar 150 through the first electrode pad 195o and the second electrode pad 106, thereby being connected to a source area of the selection transistor SX. Plus, a source area of the source follower transistor SFX may be connected to an output line layer disposed in the second semiconductor chip 100-2. For example, the output line layer may be disposed on the second semiconductor chip 100-2 and connected to the second electrode pad 106.

Figure 4:
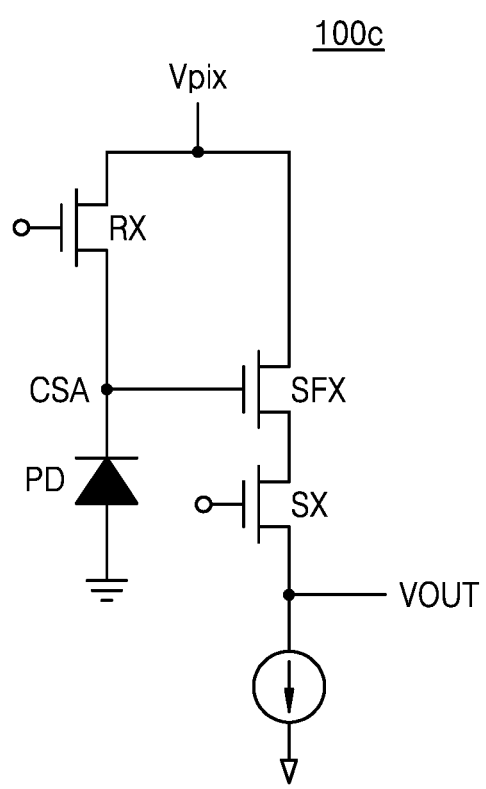
FIG. 4 is a circuit diagram of a pixel of an image sensor including vertical channel transistors having a 3TR structure according to an example embodiment of the inventive concept.
Figure 5:
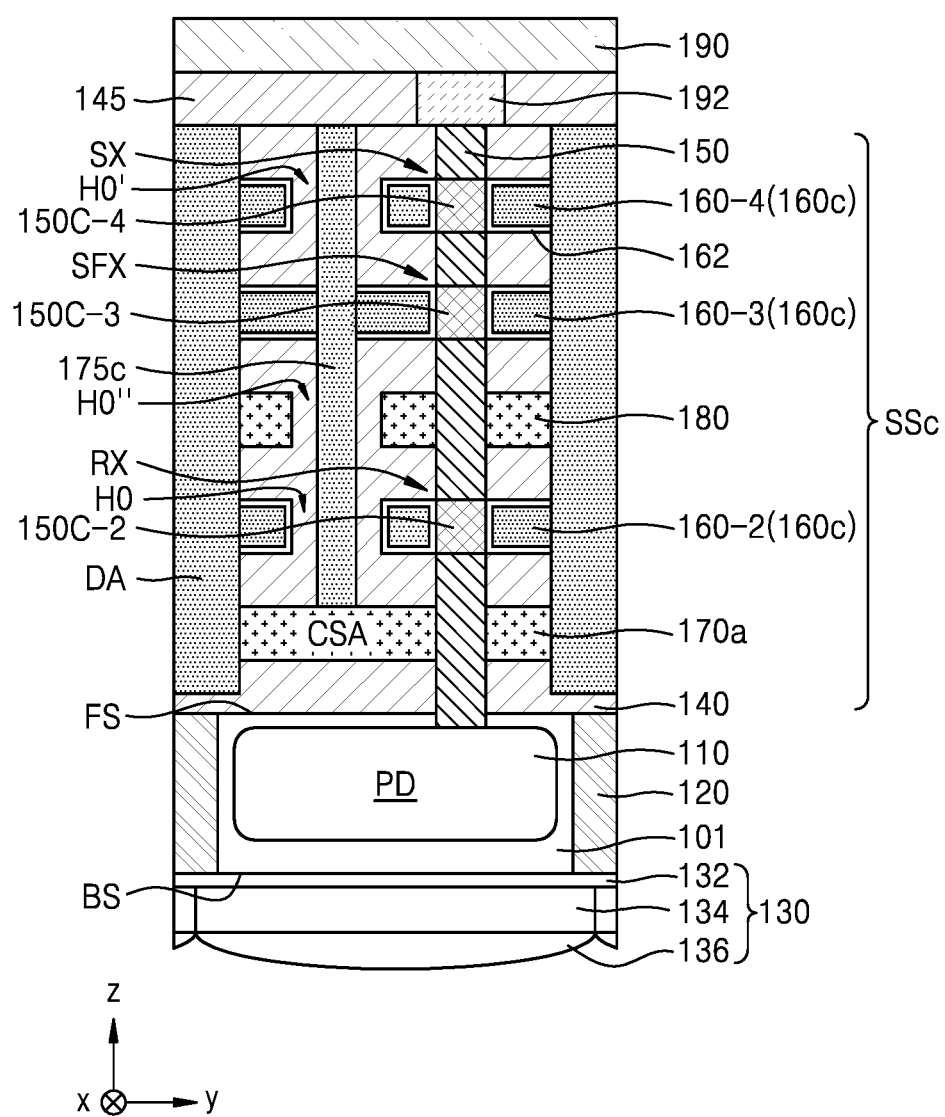
FIG. 5 is a cross-sectional view of a pixel of the image sensor of FIG. 4.

FIG. 4 is a circuit diagram of a pixel of an image sensor configured as a vertical channel transistor having a 3TR structure according to an example embodiment of the inventive concept, and FIG. 5 is a cross-sectional view of the pixel of the image sensor of FIG. 4, which may correspond to FIG. 2C.

Referring to FIG. 4, an image sensor 100c according to the present embodiment may be different from the image sensor 100 of FIG. 1 by having a 3TR structure in which a signal is output from the photodiode PD by using three transistors. For example, in the image sensor 100c according to the present embodiment, one pixel includes a photodiode PD, a charge storage area CSA, and pixel transistors, and the pixel transistors include, for example, the reset transistor RX, the source follower transistor SFX, and the selection transistor SX.

To briefly describe the operation of the image sensor 100c according to the present embodiment, when both the reset transistor RX and the selection transistor SX are in an off state, the photodiode PD is in a floating state, and thus charges are continuously accumulated in the charge storage area CSA. The charge storage area CSA may be the photodiode PD itself or a separate conductive area connected to the photodiode PD. For example, in the image sensor 100c according to the present embodiment, the charge storage area CSA may be separately formed for the formation of a charge storage strap 175c.

When charge is collected in the charge storage area CSA, the selection transistor SX is turned on, and a signal voltage corresponding to the collected charges is output through an output line connected to a drain area of the selection transistor SX. Thereafter, the reset transistor RX is turned on and off, and thus charges accumulated in the photodiode PD are discharged and the photodiode PD is reset. Subsequently, when the selection transistor SX is turned off, charges are collected in the charge storage area CSA again. In addition, before the selection transistor SX is turned off after reset, a reference signal voltage is extracted and the reference signal voltage is subtracted from a signal voltage output before the reset, thereby extracting an output signal based on charges generated by the photodiode PD.

Referring to FIG. 5, the image sensor 100c according to the present embodiment may include the substrate 101, the photodiode 110, the pixel isolation structure 120, the light transmitting layer 130, a stacked structure SSc, and the output line layer 190. The photodiode 110, the pixel isolation structure 120, the light transmitting layer 130, and the output line layer 190 are the same as those described above with reference to FIGS. 2A to 2C.

The stacked structure SSc is disposed on the front surface FS of the substrate 101 and may include the interlayer insulation layer 140, the active pillar 150, a gate line unit 160c, a charge storage area (CSA) 170a, and the power line layer 180. The interlayer insulation layer 140, the active pillar 150, and the power line layer 180 are the same as those described above with reference to FIGS. 2A to 2C. In addition, the CSA 170a and the charge storage strap 175c may be substantially the same as the FD area 170 and the FD strap 175 in function or structure. Therefore, descriptions of the CSA 170a and the charge storage strap 175c are omitted.

The gate line unit 160c includes second to fourth gate line layers 160-2 to 160-4, and the second to fourth gate line layers 160-2 to 160-4 may constitute pixel transistors together with a portion of the active pillar 150. For example, the second gate line layer 160-2 may constitute the reset transistor RX together with the second channel area 150C-2, the third gate line layer 160-3 may constitute the source follower transistor SFX together with the third channel area 150C-3, and the fourth gate line layer 160-4 may constitute the selection transistor SX together with the fourth channel area 150C-4.

In the image sensor 100c according to the present embodiment, the number of layers of the gate line unit 160c is not limited to three. For example, according to some embodiments of the inventive concept, the gate line unit 160c may include one or two gate line layers. In a structure in which the gate line unit 160c includes one gate line layer, only the reset transistor RX may be disposed in the first semiconductor chip 100-1, and the source follower transistor SFX and the selection transistor SX may be arranged in the second semiconductor chip 100-2. The connection relationship of the source follower transistor SFX to the charge storage strap 175c and the power line layer 180 through Cu-to-Cu bonding of the first semiconductor chip 100-1 and the second semiconductor chip 100-2 is the same as the description given above for the image sensor 100a with reference to FIG. 3A. In addition, in a structure in which the gate line unit 160c includes two gate line layers, only the reset transistor RX and the selection transistor SX may be arranged in the first semiconductor chip 100-1, and the source follower transistor SFX may be disposed in the second semiconductor chip 100-2. The connection relationship of the source follower transistor SFX to the charge storage strap 175c and the power line layer 180 through Cu-to-Cu bonding of the first semiconductor chip 100-1 and the second semiconductor chip 100-2 is the same as the description given above for the image sensor 100b with reference to FIG. 3B.

Figure 6A:
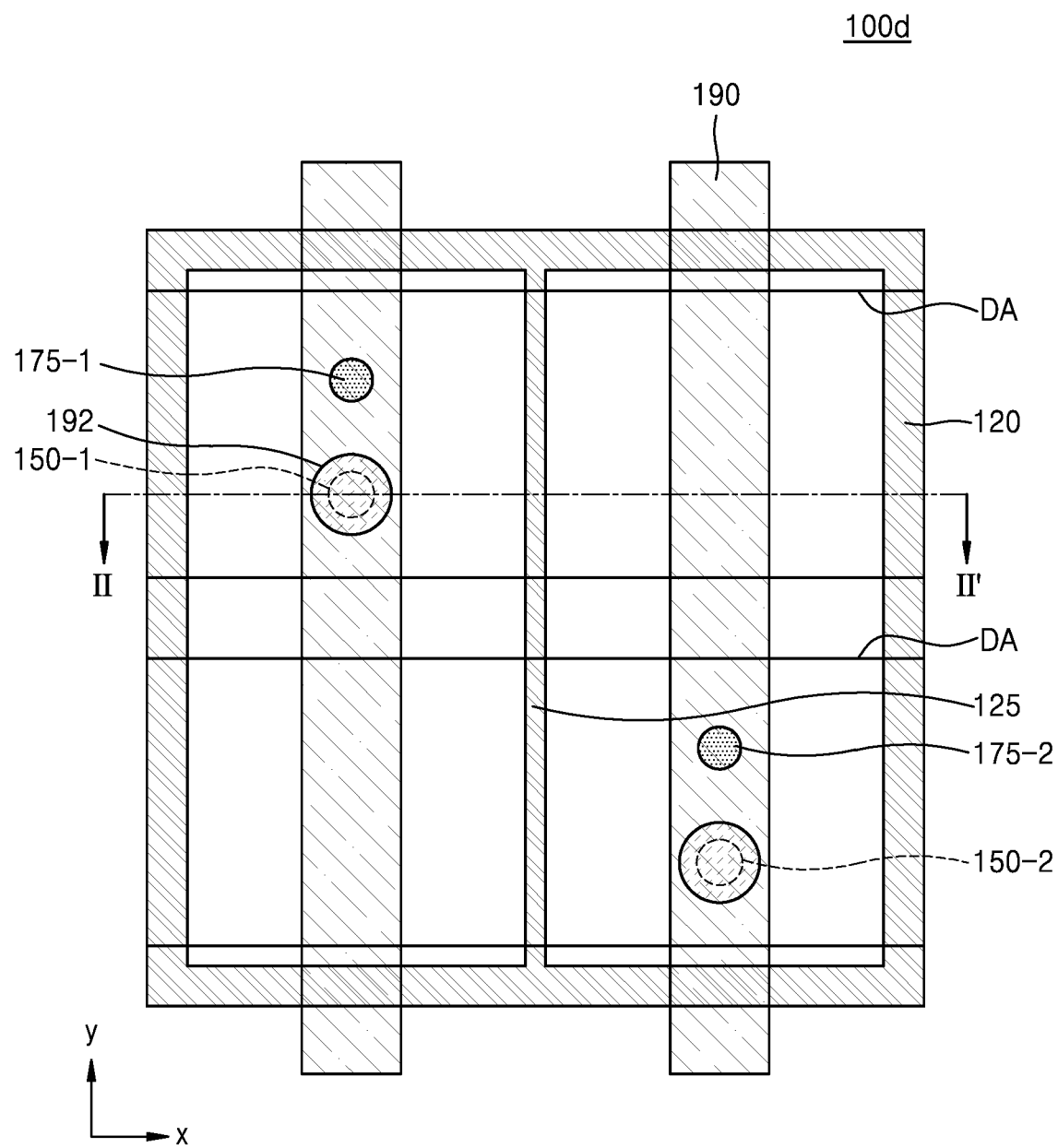
FIGS. 6A and 6B are a plan view and a cross-sectional view of a pixel of an image sensor including a transistor having a vertical channel according to an example embodiment of the inventive concept.
Figure 6B:
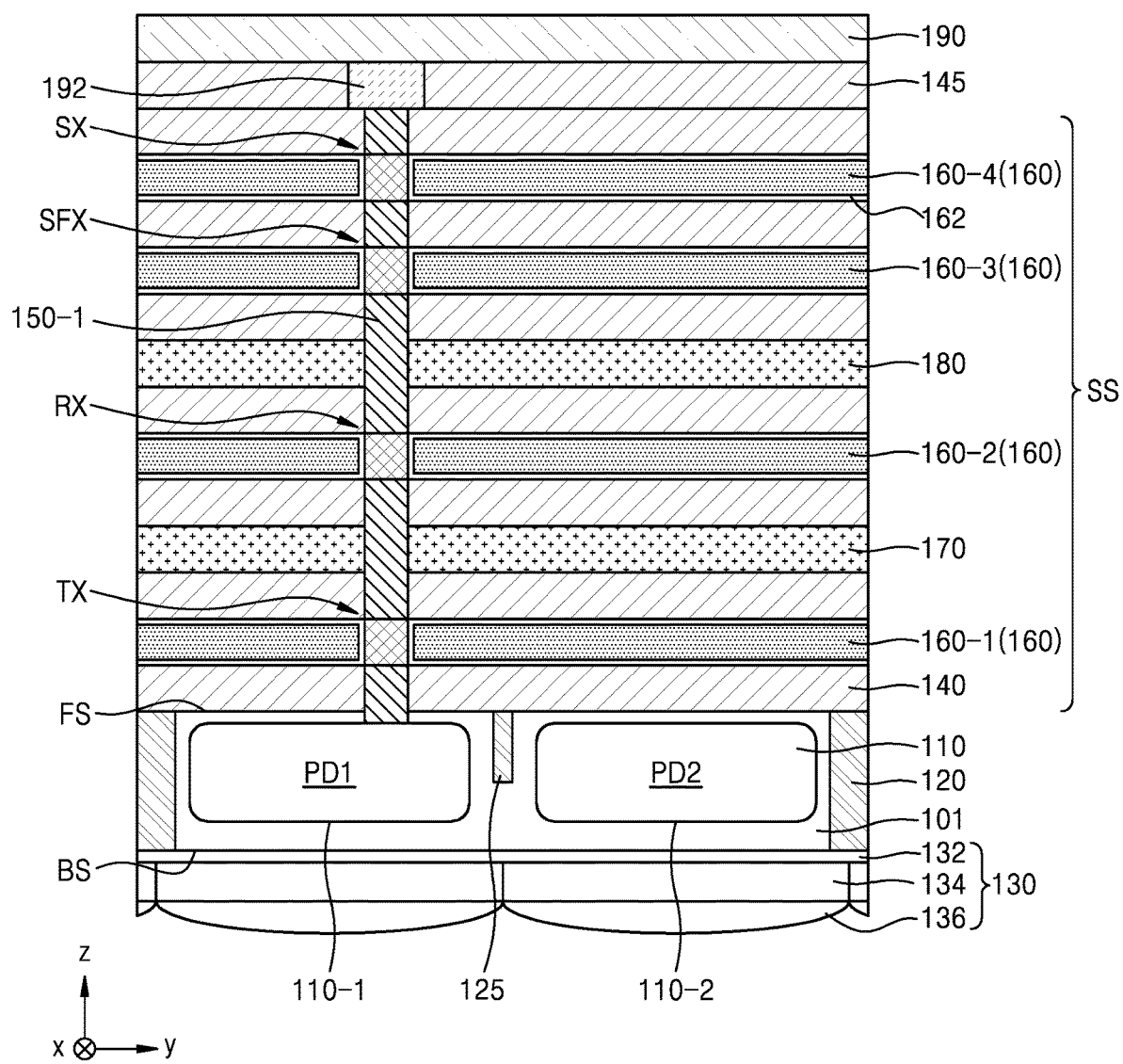

FIGS. 6A and 6B are a plan view and a cross-sectional view of a pixel of an image sensor according to an example embodiment of the inventive concept, wherein FIG. 6B is a cross-sectional view taken along a line II-II' of FIG. 6A.

Referring to FIGS. 6A and 6B, an image sensor 100d according to the present embodiment may be different from the image sensor 100 of FIG. 2B by including a shared pixel in which two photodiodes 110-1 PD1 and 100-2 PD2 are arranged together. For example, in the image sensor 100d according to the present embodiment, a shared pixel is defined by the pixel isolation structure 120, and a pixel of a first photodiode 110-1 PD1 and a pixel of a second photodiode 110-2 PD2 may be arranged together in the shared pixel. Therefore, the shared pixel may have a 2PD structure. However, the structure of the shared pixel is not limited to the 2PD structure. For example, the shared pixel may have a 4PD structure or an 8PD structure. A micro lens may be disposed over the shared pixel in which the two photodiodes 110-1 PD1 and 100-2 PD2 are arranged together or two micro lenses may be disposed corresponding to each of the two photodiodes 110-1 PD1 and 100-2 PD2.

The pixel of the first photodiode 110-1 and the pixel of the second photodiode 110-2 may be half-separated by a shared pixel isolation structure 125. In other words, the pixel of the first photodiode 110-1 and the pixel of the second photodiode 110-2 may be partially separated by the shared pixel isolation structure 125. For example, as shown in FIG. 6B, the shared pixel isolation structure 125 may have a structure that penetrates only a portion of the substrate 101 instead of completely penetrating through the substrate 101. Therefore, the pixel of the first photodiode 110-1 and the pixel of the second photodiode 110-2 may share a lower portion of the substrate 101 with each other.

As shown in FIG. 6A, a first active pillar 150-1 connected to the first photodiode 110-1 may be disposed in an upper portion of the pixel of the first photodiode 110-1 in the second direction (Y direction), and a second active pillar 150-2 connected to the second photodiode 110-2 may be disposed in a lower portion of the pixel of the second photodiode 110-2 in the second direction (Y direction). However, the positions of the first active pillar 150-1 and the second active pillar 150-2 are not limited thereto. For example, in the second direction (y direction), the first active pillar 150-1 may be disposed in the lower portion, and the second active pillar 150-2 may be disposed in the upper portion. Here, when viewed from above, the first photodiode 110-1 and the second photodiode 110-2 may each have a structure that is elongated in the second direction (y direction) and occupies most of the pixels.

In the image sensor 100d according to the present embodiment, the stacked structure SS may be disposed on the front surface FS of the substrate 101. The stacked structure SS may include the interlayer insulation layer 140, the first active pillar 150-1, the second active pillar 150-2, the gate line unit 160, the FD area 170, and the power line layer 180. The stacked structure SS may be substantially the same as the stacked structure SS of the image sensor 100 of FIG. 2C. Therefore, detailed descriptions thereof are omitted. In addition, in the image sensor 100d according to the present embodiment, the gate line unit 160 of the stacked structure SS may include four gate line layers, in other words, the first to fourth gate line layers 160-1 to 160-4. However, the inventive concept is not limited thereto, and a gate line unit of a stacked structure may include three or two gate line layers, and such a structure is as described above with reference to FIGS. 3A and 3B.

Figure 7B:
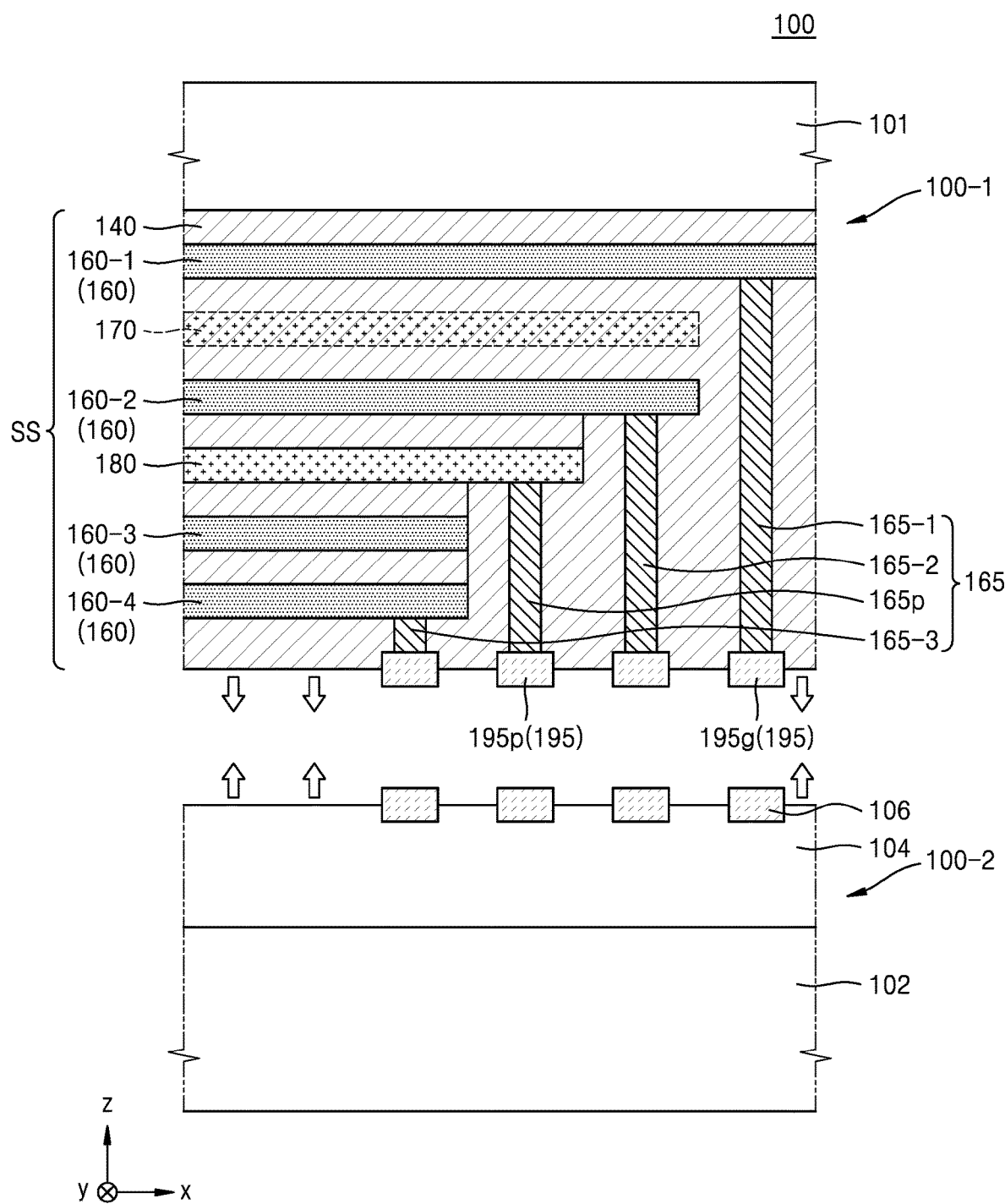
Figure 7C:
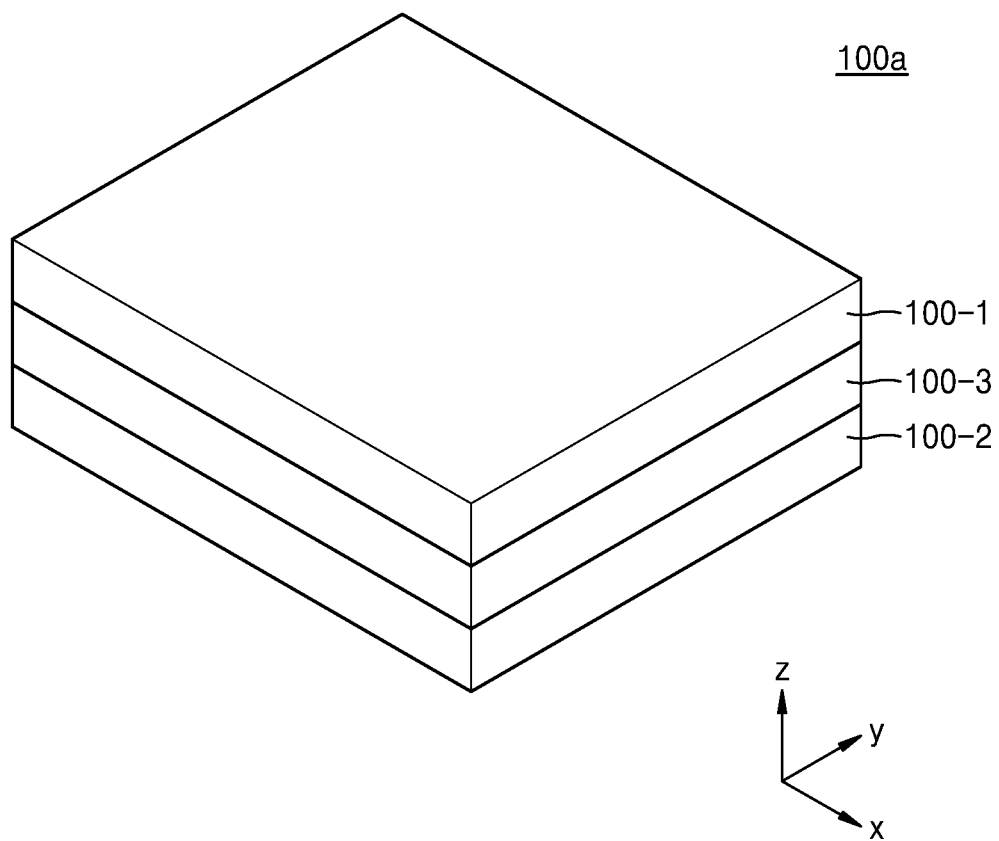

FIGS. 7A to 7C show a stacked structure of an image sensor according to embodiments of the inventive concept and, more particularly, are an exploded perspective view of a state in which a first semiconductor chip and a second semiconductor chip are separated, a partial cross-sectional view, and a perspective view of a structure in which three semiconductor chips are stacked. FIG. 7B is a cross-sectional view taken along a line III-III' of FIG. 7A.

Referring to FIGS. 7A and 7B, the image sensor 100 according to the present embodiment may include the first semiconductor chip 100-1 and the second semiconductor chip 100-2. The image sensor 100 according to the present embodiment may have a structure in which the first semiconductor chip 100-1 is stacked on the second semiconductor chip 100-2.

The first semiconductor chip 100-1 may include a pixel area PA and a first peripheral area PE1. The pixel area PA may be disposed in a central area of the first semiconductor chip 100-1, and a plurality of pixels may be arranged in the pixel area PA in a 2-dimensional array structure. The first peripheral area PE1 may be disposed outside the pixel area PA. For example, the first peripheral area PE1 may be disposed outside the pixel area PA in a structure that surrounds four edges of the pixel area PA. However, according to some embodiments of the inventive concept, the first peripheral area PE1 may be disposed outside only two or three edges of the pixel area PA. Electrode pad areas EPx, EPy1, and EPy2 may be arranged in the first peripheral area PE1. A plurality of first electrode pads 195 may be arranged in the electrode pad areas EPx, EPy1, and EPy2. As shown in FIG. 7B, the first electrode pads 195 may be arranged on the bottom surface of the first semiconductor chip 100-1. In addition, gate line layers 160-1, 160-2, and 160-4 may be connected to corresponding first electrode pads 195g through vertical contacts 165, and the power line layer 180 is vertically connected to the first electrode pads 195. More specifically, the power line layer 180 may be connected to a corresponding first electrode pad 195p through a vertical contact 165p. In addition, the first gate line layer 160-1 may be connected to a corresponding first electrode pad 195g through a vertical contact 165-1, the second gate line layer 160-2 may be connected to a corresponding first electrode pad 195g through a vertical contact 165-2, and the fourth gate line layer 160-4 may be connected to a corresponding first electrode pad 195g through a vertical contact 165-3. The third gate line layer 160-3 may not be connected to one of the first electrode pads 195. In the case of the source follower transistor SFX, since the gate is connected to the FD area 170, a first electrode pad corresponding to the third gate line layer 160-3 may not be disposed in the electrode pad areas EPx, EPy1, and EPy2.

As shown in FIG. 7B, in the first semiconductor chip 100-1, in the third direction (z direction), the substrate 101 may be positioned in the upper portion of the first semiconductor chip 100-1, and the stacked structure SS may be positioned below the substrate 101. In addition, the gate line layers 160-1, 160-2, and 160-4 and the power line layer 180 may have a stepped structure at an end in the first direction (x direction). Through such a stepped structure, the gate line layers 160-1, 160-2, and 160-4 and the power line layer 180 may be connected to corresponding first electrode pads 195 through the vertical contacts 165. The electrode pad areas EPx, EPy1, and EPy2 may include a column electrode pad area EPx extending in the first direction (x direction) and two row electrode pad areas EPy1 and EPy2 extending in the second direction (Y direction). The two row electrode pad areas EPy1 and EPy2 are areas in which first electrode pads 195g and 195p corresponding to the gate line layers 160-1, 160-2, and 160-4 and the power line layer 180 are arranged may be arranged on both sides of the pixel area PA in the first direction (X direction). However, according to some embodiments of the inventive concept, any one of the two row electrode pad areas EPy1 and EPy2 may be omitted. The column electrode pad area EPx may be an area in which the first electrode pad 195 connected to the output line layer 190 is disposed. According to some embodiments of the inventive concept, the column electrode pad area EPx may also be disposed on both sides of the pixel area PA in the second direction (y direction).

The second semiconductor chip 100-2 may include the logic area LA and a second peripheral area PE2. The logic area LA is disposed in a center area of the second semiconductor chip 100-2 and may include a plurality of analog signal processing elements such as ADC circuits and logic elements. The logic elements may include various elements for processing pixel signals from pixels of the first semiconductor chip 100-1. For example, the logic elements may include an image signal processing element, a control element, etc. However, elements included in the logic area LA are not limited to the above-stated elements. For example, elements for supplying power or ground to pixels or passive element like resistors or capacitors may be arranged in the logic area LA.

The second peripheral area PE2 has a structure surrounding the logic area LA and may be disposed outside the logic area LA. For example, the second peripheral area PE2 may be disposed outside the logic area LA and surround four edges of the logic area LA. However, according to some embodiments of the inventive concept, the second peripheral area PE2 may be disposed outside only two or three edges of the logic area LA. An electrode pad area may also be disposed in the second peripheral area PE2 in correspondence to the electrode pad areas EPx, EPy1, and EPy2 of the first semiconductor chip 100-1.

As shown in FIG. 7B, in the second semiconductor chip 100-2, in the third direction (z direction), the substrate 102 may be positioned in the lower portion of the second semiconductor chip 100-2, and the wiring layer 104 may be disposed on the substrate 102. Driving circuits for driving logic elements and the gate line unit 160 formed in the first semiconductor chip 100-1 may be formed on the substrate 102. Wires of the wiring layer 104 may be connected to the driving circuits. In addition, the wires of the wiring layer 104 may be connected to the second electrode pad 106 disposed on the top surface of the second semiconductor chip 100-2.

As indicated by the arrows facing down and up adjacent to the rightmost first electrode pad 195 and second electrode pad 106, the first semiconductor chip 100-1 and the second semiconductor chip 100-2 may be coupled to each other through Cu-to-Cu bonding. In addition, the first electrode pads 195 of the first semiconductor chip 100-1 may be connected to corresponding second electrode pads 106 of the second semiconductor chip 100-2 through the Cu-to-Cu bonding.

Referring to FIG. 7C, the image sensor 100a according to the present embodiment may include the first semiconductor chip 100-1, the second semiconductor chip 100-2, and the third semiconductor chip 100-3. In the image sensor 100a according to the present embodiment, the third semiconductor chip 100-3 and the first semiconductor chip 100-1 may be sequentially stacked on the second semiconductor chip 100-2. As shown in FIG. 3A, the photodiode PD, the transfer transistor TX, and the reset transistor RX may be arranged in the first semiconductor chip 100-1. In addition, logic elements and driving circuits may be arranged in the second semiconductor chip 100'2. The source follower transistor SFX, the selection transistor SX, and an ADC may be arranged in the third semiconductor chip 100-3. According to some embodiments of the inventive concept, the ADC may be disposed in the second semiconductor chip 100-2.

Moreover, as shown in FIG. 3B, the photodiode PD, the transfer transistor TX, the reset transistor RX, and the selection transistor SX may be arranged in the first semiconductor chip 100-1, and the source follower transistor SFX and an ADC may be arranged in the semiconductor chip 100-3.

Figure 8:
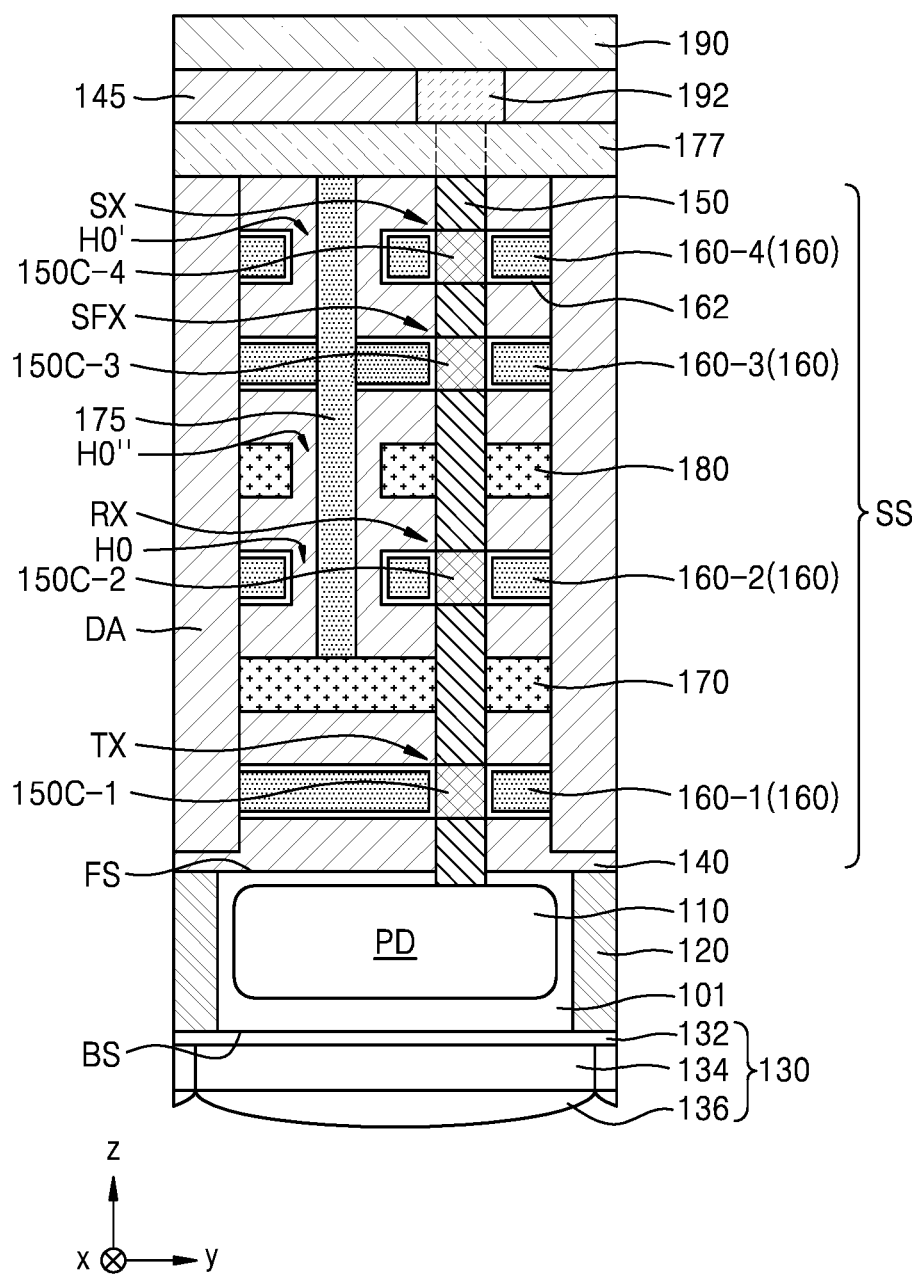
FIG. 8 is a cross-sectional view of a pixel of an image sensor including a transistor having a vertical channel according to an example embodiment of the inventive concept.

FIG. 8 is a cross-sectional view of a pixel of an image sensor according to an example embodiment of the inventive concept, which may correspond to FIG. 2C.

Referring to FIG. 8, an image sensor 100e according to the present embodiment may be different from the image sensor 100 of FIG. 2C in that the FD strap 175 is connected to an adjacent FD strap 175 through a connection wire 177. For example, in the image sensor 100e according to the present embodiment, the connection wire 177 extending in the second direction (y direction) may be disposed on the stacked structure SS, and the FD strap 175 may be connected to an FD strap 175 adjacent thereto in the second direction (Y direction) through the connection wire 177. Therefore, two FD areas 170 adjacent to each other in the second direction (y direction) may be connected to each other, and pixels corresponding thereto may share the FD areas 170. The connection between FD straps 175 through the connection wire 177 is not limited to connection between two adjacent FD straps 175. For example, four adjacent FD straps 175 may be connected to one another through the connection wire 177 extending in the first direction (x direction) and/or the second direction (y direction).

Figure 9A:
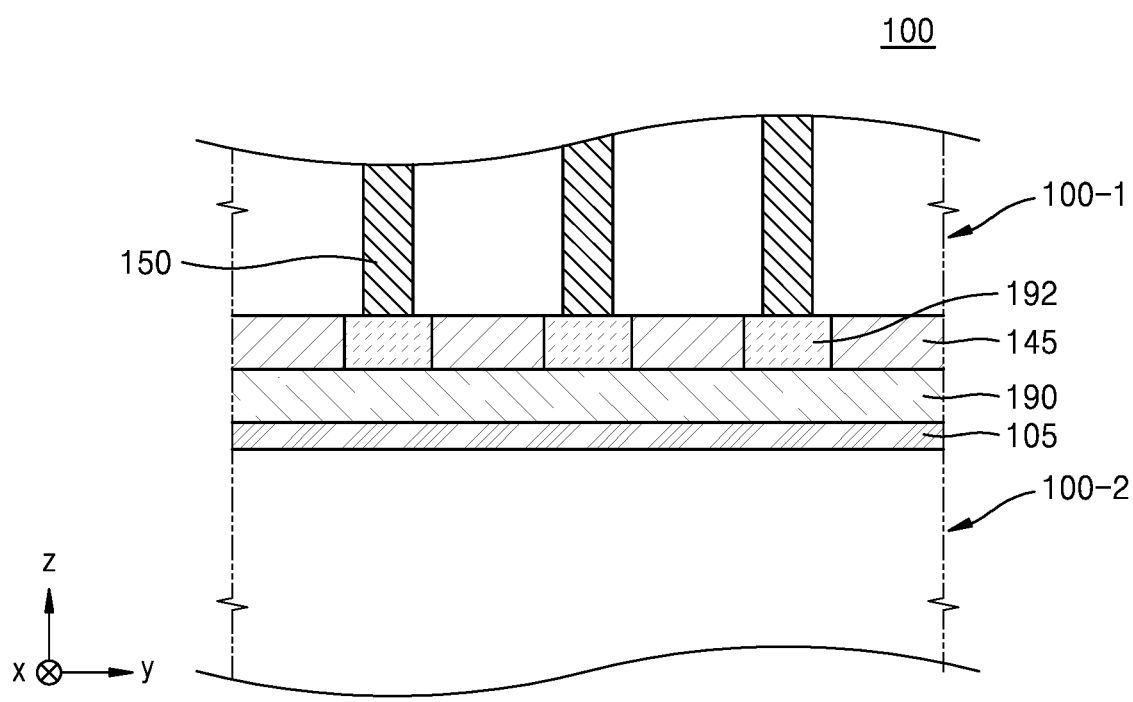
FIGS. 9A and 9B are cross-sectional views of a stacked structure of an image sensor including a transistor having a vertical channel according to example embodiments of the inventive concept.
Figure 9B:
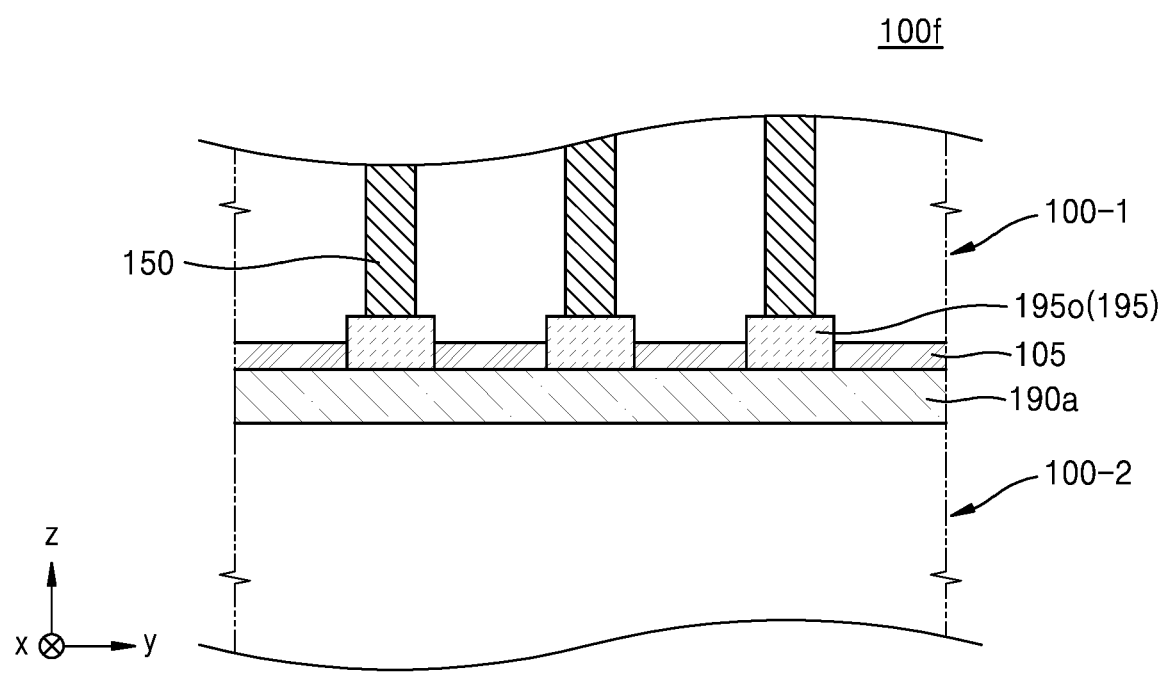

FIGS. 9A and 9B are cross-sectional views of stacked structures of an image sensor according to example embodiments of the inventive concept.

Referring to FIG. 9A, the image sensor 100 according to the present embodiment may have a structure in which the first semiconductor chip 100-1 is stacked on the second semiconductor chip 100-2. In addition, the first semiconductor chip 100-1 and the second semiconductor chip 100-2 may be coupled to each other through Cu-to-Cu bonding. The output line layer 190 extending in the second direction (y direction) may be disposed on the bottom surface of the first semiconductor chip 100-1. The output line layer 190 may be connected to the active pillar 150 of each of pixels arranged in the second direction (y direction) through the vertical contact 192. The vertical contact 192 may pass through the upper insulation layer 145. FIG. 9A shows a pixel area (refer to PA of FIG. 7A) of the first semiconductor chip 100-1, and the output line layer 190 may extend toward a column electrode pad area (refer to EPx of FIG. 7A) in the second direction (y direction). The output line layer 190 may be connected to a corresponding second electrode pad (refer to 106 of FIG. 7B) of the second semiconductor chip 100-2 in the column electrode pad area EPx. An inter-chip insulation layer 105 may be disposed between the first semiconductor chip 100-1 and the second semiconductor chip 100-2. For example, the inter-chip insulation layer 105 may be provided between the output line layer 190 and the upper surface of the second semiconductor chip 100-2.

Referring to FIG. 9B, the image sensor 100f according to the present embodiment may have a structure in which the first semiconductor chip 100-1 is stacked on the second semiconductor chip 100-2. In addition, the first semiconductor chip 100-1 and the second semiconductor chip 100-2 may be coupled to each other through Cu-to-Cu bonding. An output line layer 190a extending in the second direction (y direction) may be disposed on the top surface of the second semiconductor chip 100-2. The output line layer 190a may be connected to the first electrode pad 195o of the first semiconductor chip 100-1. The first electrode pad 195o may be connected to the active pillar 150 of each of pixels arranged in the second direction (y direction). Therefore, the active pillar 150 of each of the pixels may be connected to the output line layer 190a of the second semiconductor chip 100-2 through the first electrode pad 195o. FIG. 9B shows the pixel area (refer to PA of FIG. 7A) of the first semiconductor chip 100-1. Therefore, in the pixel area PA, the active pillars 150 may be electrically connected to the output line layer 190a of the second semiconductor chip 100-2 through the first electrode pad 195o. The inter-chip insulation layer 105 may be disposed between the first semiconductor chip 100-1 and the second semiconductor chip 100-2. For example, the inter-chip insulation layer 105 may be provided between the output line layer 190a and the first semiconductor chip 100-1.

FIGS. 10A to 20B are plan views and cross-sectional views showing a process of manufacturing the image sensor of FIG. 2C. FIGS. 10B, 12B, 13B, 16B, 17B, 18B, 19B, and 20B are cross-sectional views taken along lines IV-IV' of FIGS. 10A, 12A, 13A, 16A, 17A, 18A, 19A, and 20A, respectively. Descriptions of FIGS. 10A to 20B will be given below with reference to FIGS. 1 to 2C, and descriptions already given above with reference to FIGS. 1 to 9B will be briefly given or omitted.

Figure 10A:
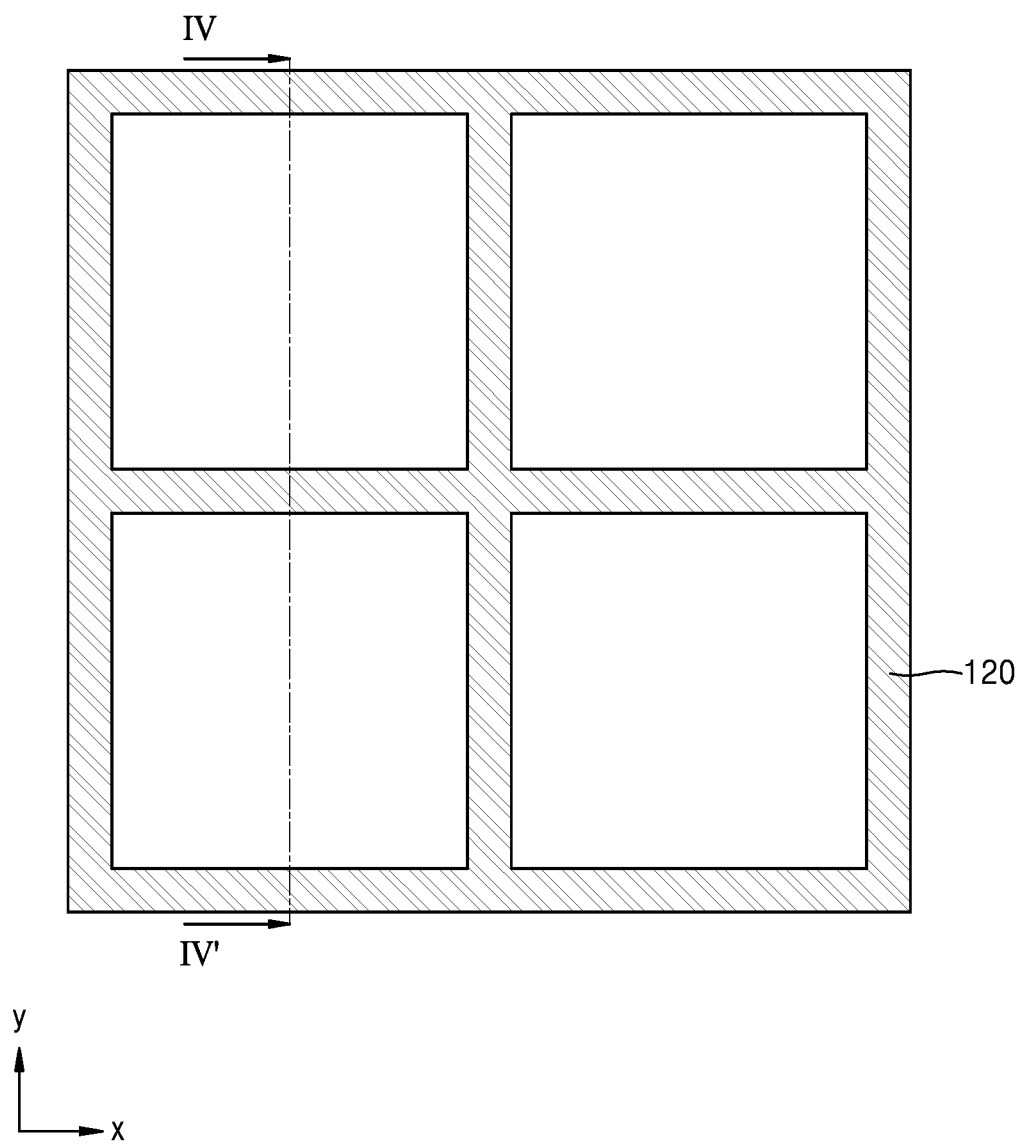
FIGS. 10A, 10B, 11, 12A, 12B, 13A, 13B, 14, 15, 16A, 16B, 17A, 17B, 18A, 18b, 19A, 19B, 20A and 20B are plan views and cross-sectional views showing a process of manufacturing the image sensor of FIG. 2C.
Figure 10B:
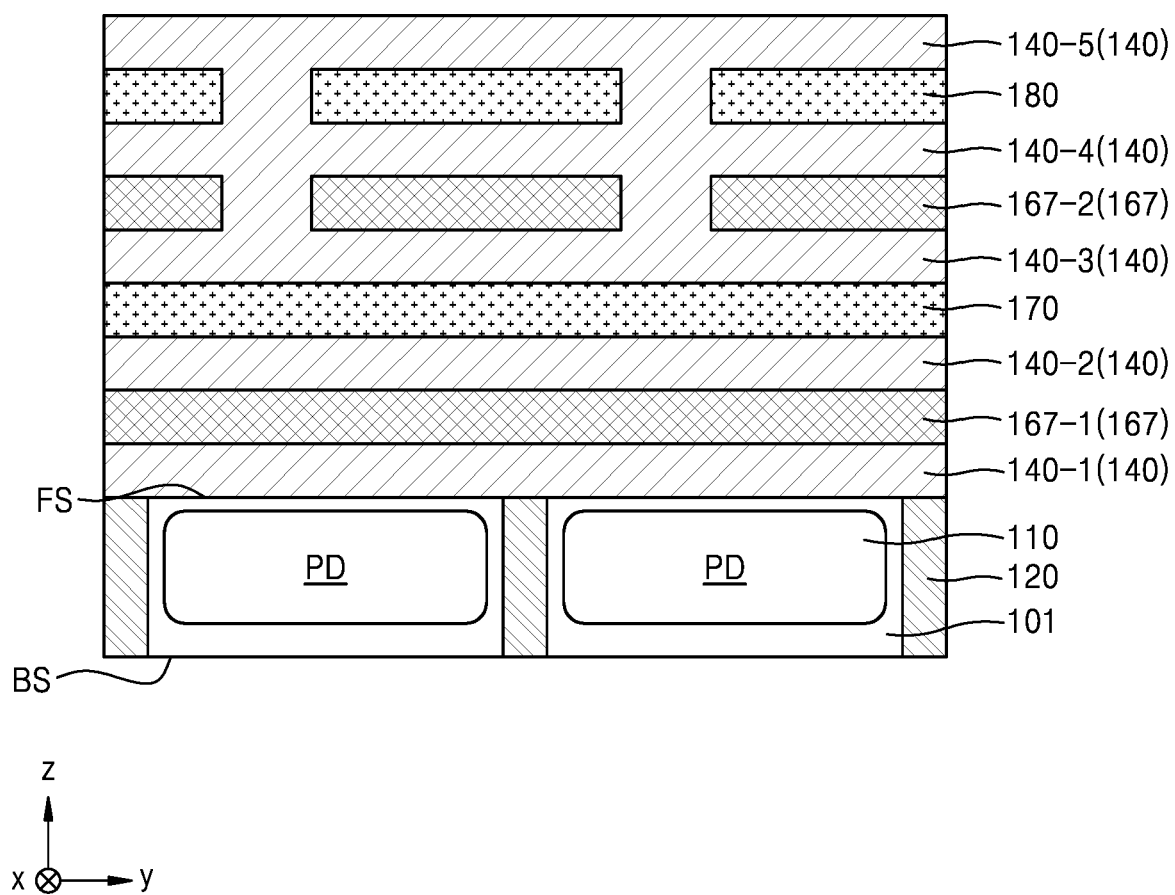

Referring to FIGS. 10A and 10B, according to a method of manufacturing the image sensor 100 according to the present embodiment, first, photodiodes 110 are formed in the substrate 101. The photodiodes 110 may be separated from one another by the pixel isolation structure 120. A first insulation layer 140-1, a first sacrificial layer 167-1, a second insulation layer 140-2, a first conductive layer 170, and a third insulation layer 140-3 are sequentially formed on the substrate 101. The first to third insulation layers 140-1 to 140-3 may include, for example, an oxide-based insulation material like silicon oxide, and the first sacrificial layer 167-1 may include, for example, a nitride-based insulation material like silicon nitride. In addition, the first conductive layer 170 may include, for example, polysilicon. However, the materials constituting the first to third insulation layers 140-1 to 140-3, the first sacrificial layer 167-1, and the first conductive layer 170 are not limited thereto.

The first to third insulation layers 140-1 to 140-3 are a portion of the interlayer insulation layer 140, and fourth, fifth, sixth and seventh insulation layers 140-4, 140-5, 140-6 and 140-7 formed later are also portions of the interlayer insulation layer 140 and may include the same material as the first to third insulation layers 140-1 to 140-3. In addition, the first sacrificial layer 167-1 is a portion of the sacrificial layer 167, and a second sacrificial layer pattern 167-2, a third sacrificial layer 167-3, and a fourth sacrificial layer pattern 167-4 formed later are also portions of the sacrificial layer 167 and may include the same material as the first sacrificial layer 167-1. The first conductive layer 170 may correspond to the FD area 170 in the image sensor 100 of FIG. 2C.

Thereafter, a second sacrificial layer is formed on the third insulation layer 140-3, and the second sacrificial layer pattern 167-2 is formed by patterning the second sacrificial layer. Subsequently, a fourth insulation layer 140-4 and a second conductive layer are formed on the second sacrificial layer pattern 167-2. Next, a second conductive layer pattern 180 is formed by patterning the second conductive layer. After the second conductive layer pattern 180 is formed, a fifth insulation layer 140-5 is formed on the second conductive layer pattern 180. The second sacrificial layer pattern 167-2 and the second conductive layer pattern 180 may each have a shape in which a portion through which the FD strap 175 to be formed later passes is removed. The second sacrificial layer pattern 167-2 and the second conductive layer pattern 180 may overlap each other. The second conductive layer pattern 180 may correspond to the power line layer 180 in the image sensor 100 of FIG. 2C.

The second sacrificial layer pattern 167-2 and the second conductive layer pattern 180 may be formed through a method below in addition to the above-described method. For example, after the third insulation layer 140-3 is formed, a second sacrificial layer, the fourth insulation layer 140-4, and the second conductive layer are sequentially formed. Thereafter, the second sacrificial layer pattern 167-2 and the second conductive layer pattern 180 are formed by patterning the second sacrificial layer, the fourth insulation layer 140-4, and the second conductive layer at once. Thereafter, the fifth insulation layer 140-5 is formed. During the patterning, the fourth insulation layer 140-4 is also patterned. However, since the fifth insulation layer 140-5 including the same material as the fourth insulation layer 140-4 fills a portion removed by the patterning, a result structure thereof may be substantially the same as a structure obtained by the individual patterning method stated above.

Figure 11:
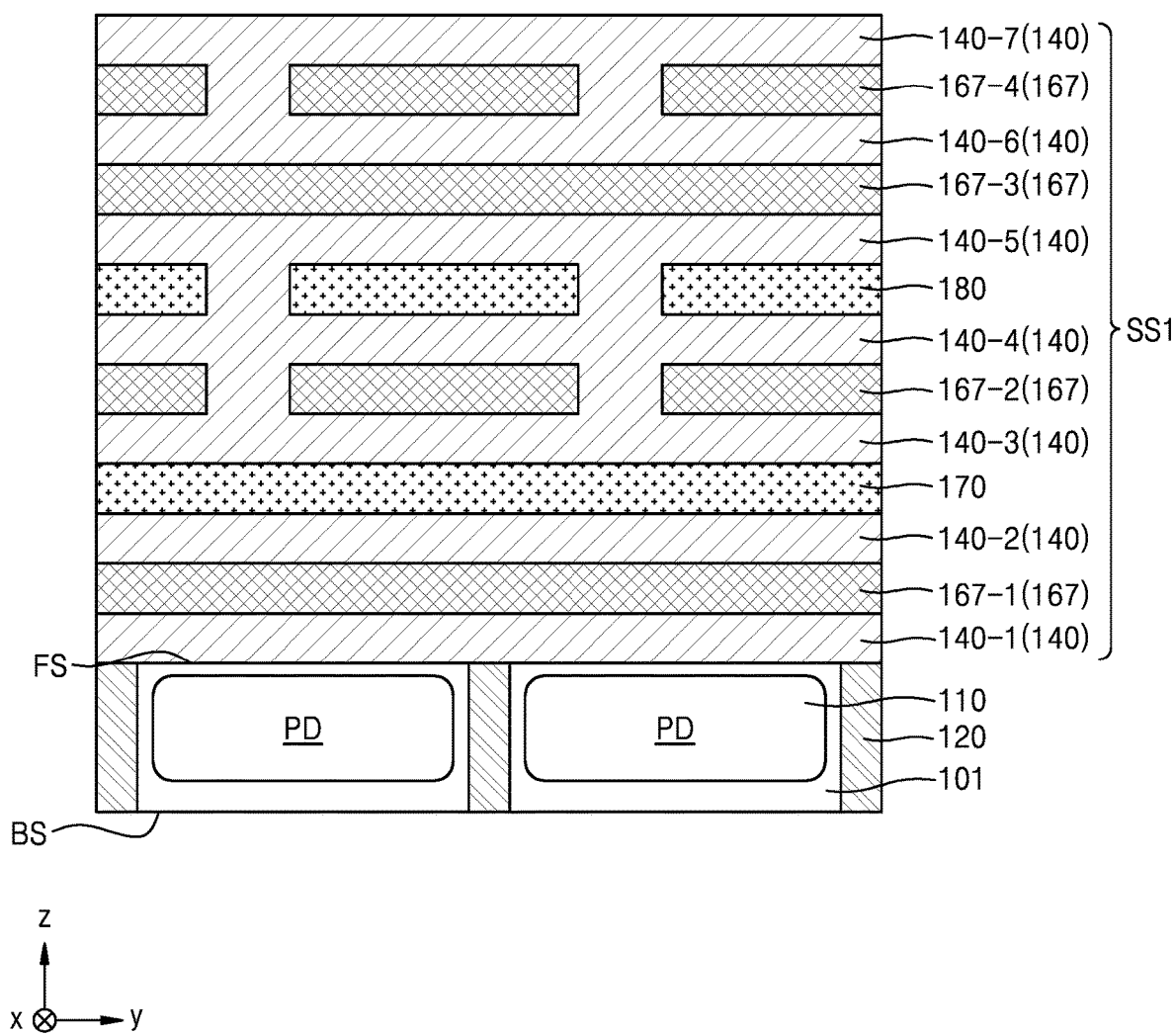

Referring to FIG. 11, the third sacrificial layer 167-3, a sixth insulation layer 140-6, and a fourth sacrificial layer are sequentially formed on the fifth insulation layer 140-5. Thereafter, the fourth sacrificial layer pattern 167-4 is formed by patterning the fourth sacrificial layer, and a seventh insulation layer 140-7 is formed on the fourth sacrificial layer pattern 167-4. Thereafter, by forming a step structure in the first peripheral area PE1 at both end portions in the first direction (x direction), e.g., the row electrode pad areas EPy1 and EPy2, a first stacked structure SS1 may be completed. Here, after the formation of the seventh insulation layer 140-7, the shape viewed from above may be substantially the same as the shape viewed from above of FIG. 10A.

Figure 12A:
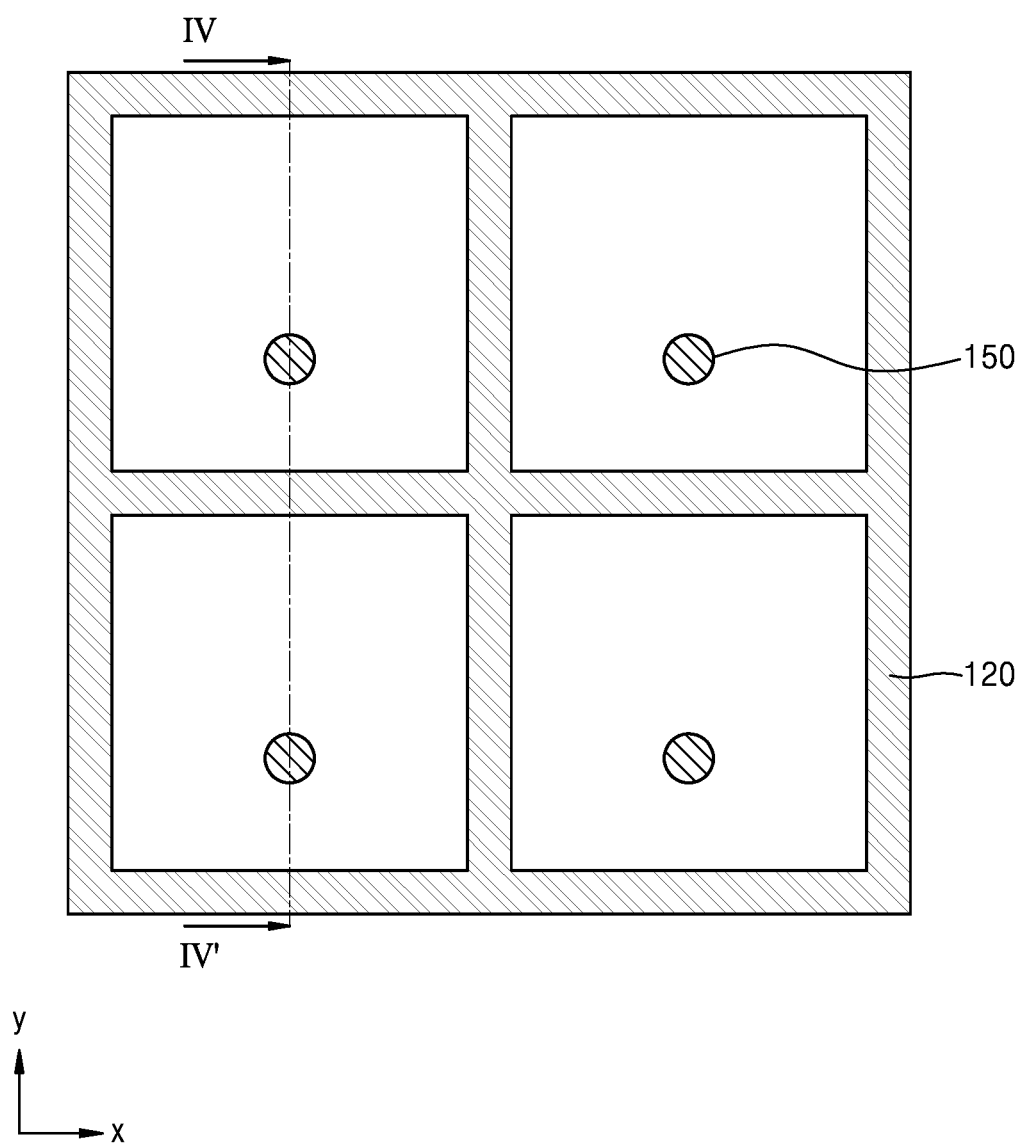
Figure 12B:
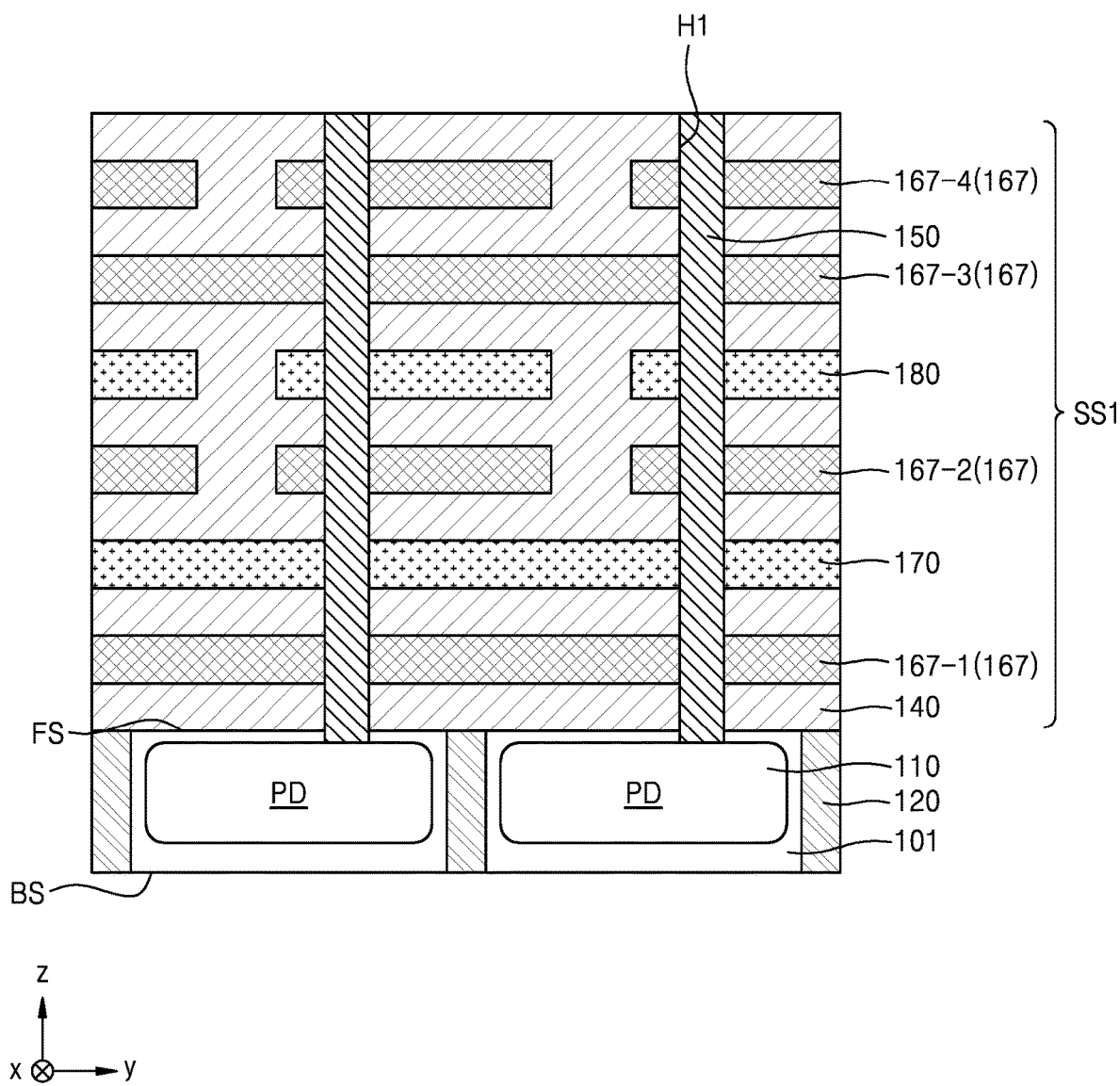

Referring to FIGS. 12A and 12B, first through holes H1 penetrating through the first stacked structure SS1 and exposing the top surface of the substrate 101 are formed. The first through holes H1 may extend to the photodiodes 110 in the substrate 101. The first through holes H1 may be formed to have an appropriate interval in the second direction (y direction) in consideration of a position at which a line trench (refer to LT of FIG. 13B) for the dividing area DA is to be formed later. The horizontal cross-section of the first through hole H1 may have a circular, elliptical, or polygonal shape, for example.

Thereafter, the active pillars 150 are formed by filling the first through holes H1 with monocrystalline silicon. The lower end of the active pillar 150 may be connected to the photodiode 110. To describe a method of forming the active pillars 150 in more detail, the active pillars 150 may be formed by filling the first through holes H1 with amorphous silicon and transferring the amorphous silicon to monocrystalline silicon through heat treatment or LEG. In addition, the active pillars 150 may be formed through LEG or a SPE process by using a monocrystalline substrate 101 as a seed. According to some embodiments of the inventive concept, the active pillars 150 may include polysilicon.

The active pillar 150 may have a pillar-like shape that fills the entire first through hole H1, e.g., a cylindrical shape, an elliptical pillar-like shape, or a polygonal pillar-like shape. However, the shape of the active pillar 150 is not limited to the above-described pillar shape. For example, the active pillar 150 may have an empty cylindrical shape that covers only the bottom surface and side surfaces of the first through hole H1. When the active pillar 150 has the empty cylindrical shape, the interior of the active pillar 150 may be filled with a buried insulation layer. The active pillar 150 may also be in contact with each of the first conductive layer 170 and the second conductive layer pattern 180.

Figure 13A:
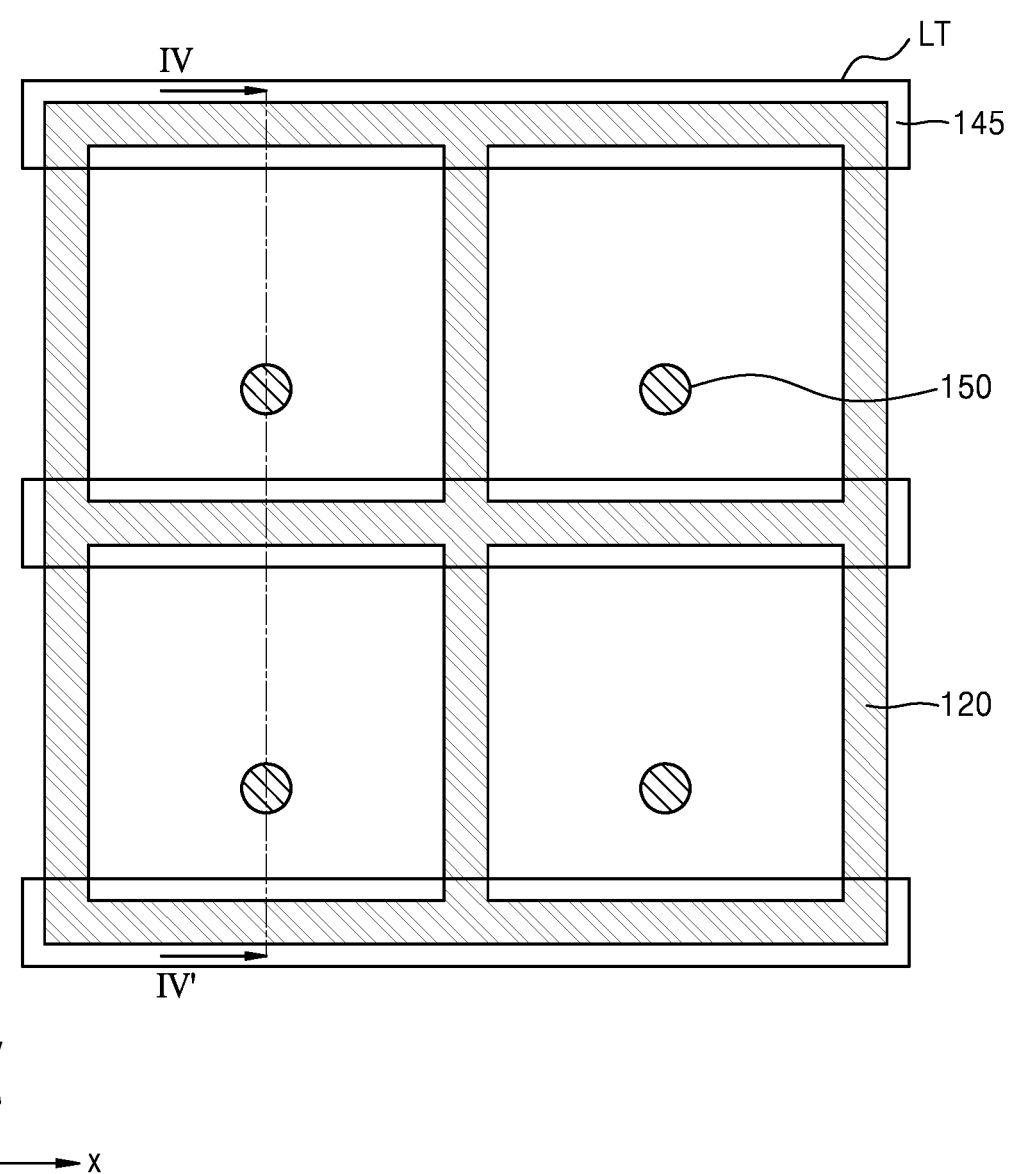
Figure 13B:
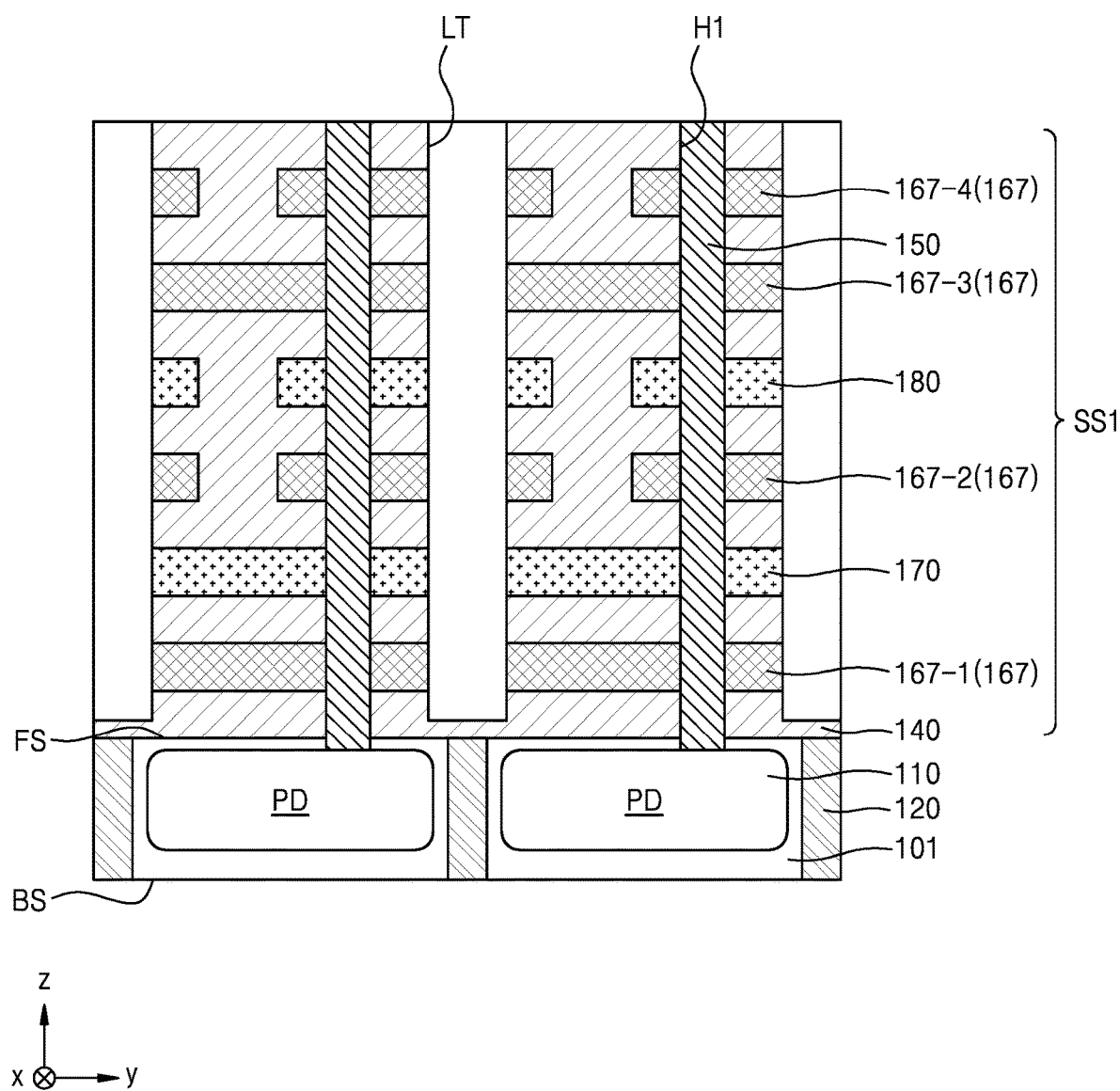

Referring to FIGS. 13A and 13B, line trenches LT penetrating through the first stacked structure SS1 and exposing the top surface of the lowermost insulation layer 140 of the first stacked structure SS1 (e.g., the first insulation layer 140-1) is formed. The first insulation layer 140-1 may be exposed through the bottom surface of a line trench LT, and the insulation layer 140, the first conductive layer 170, a sacrificial layer 167, and the second conductive layer pattern 180 may be exposed through side surfaces of the line trench LT. The line trenches LT may extend in the first direction (x direction) and have a predetermined interval in the second direction (y direction). As shown in FIG. 13B, the width of the line trench LT may be greater than the width or the diameter of the first through hole H1 in the second direction (y direction).

Figure 14:
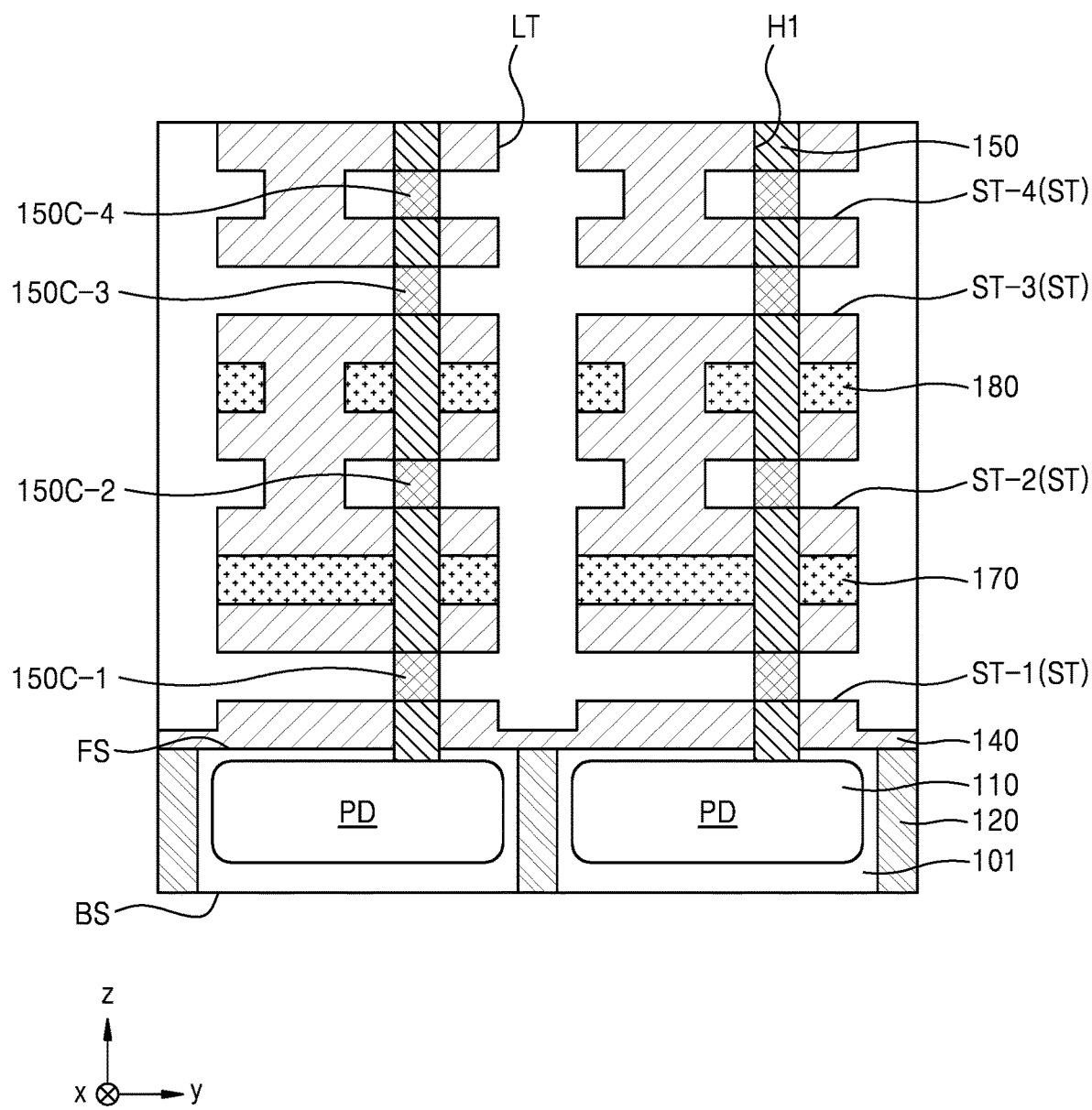

Referring to FIG. 14, the sacrificial layer 167 exposed through the line trench LT is removed through etching. For example, when the sacrificial layer 167 includes silicon nitride, the sacrificial layer 167 may be removed by wet etching using hydrogen fluoride (HF) as an etchant. Horizontal trenches ST may be formed between the insulation layers 140 through the removal of the sacrificial layer 167. In addition, as the sacrificial layer 167 is removed, portions of the side surfaces of the active pillars 150 may be exposed through the horizontal trenches ST. For example, exposed portions of the side surface of the active pillar 150 may correspond to portions at which gate insulation layers are to be formed. In addition, the exposed portions of the active pillar 150 may correspond to channel areas 150C-1 to 150C-4. An unexposed portion of the active pillar 150 may correspond to a source/drain area.

After the sacrificial layer 167 is removed, the exposed portions of the active pillars 150 are doped with an impurity. The impurity may be, for example, a p-type impurity. The doping of an impurity may be performed, for example, through plasma doping. As described above, the exposed portions of the active pillar 150 corresponds to the channel areas 150C-1 to 150C-4, and, by doping the channel areas 150C-1 to 150C-4 with an impurity, threshold voltages of corresponding transistors may be adjusted. In FIG. 14 and subsequent cross-sectional views, the channel areas 150C-1 to 150C-4 are indicated by a different hatching to be distinguished from other portions of the active pillar 150, e.g., the source/drain area. In addition, after the removal of the sacrificial layer 167 or after the doping of an impurity, the shape viewed from above may be substantially the same as the shape viewed from above of FIG. 13A.

Figure 15:
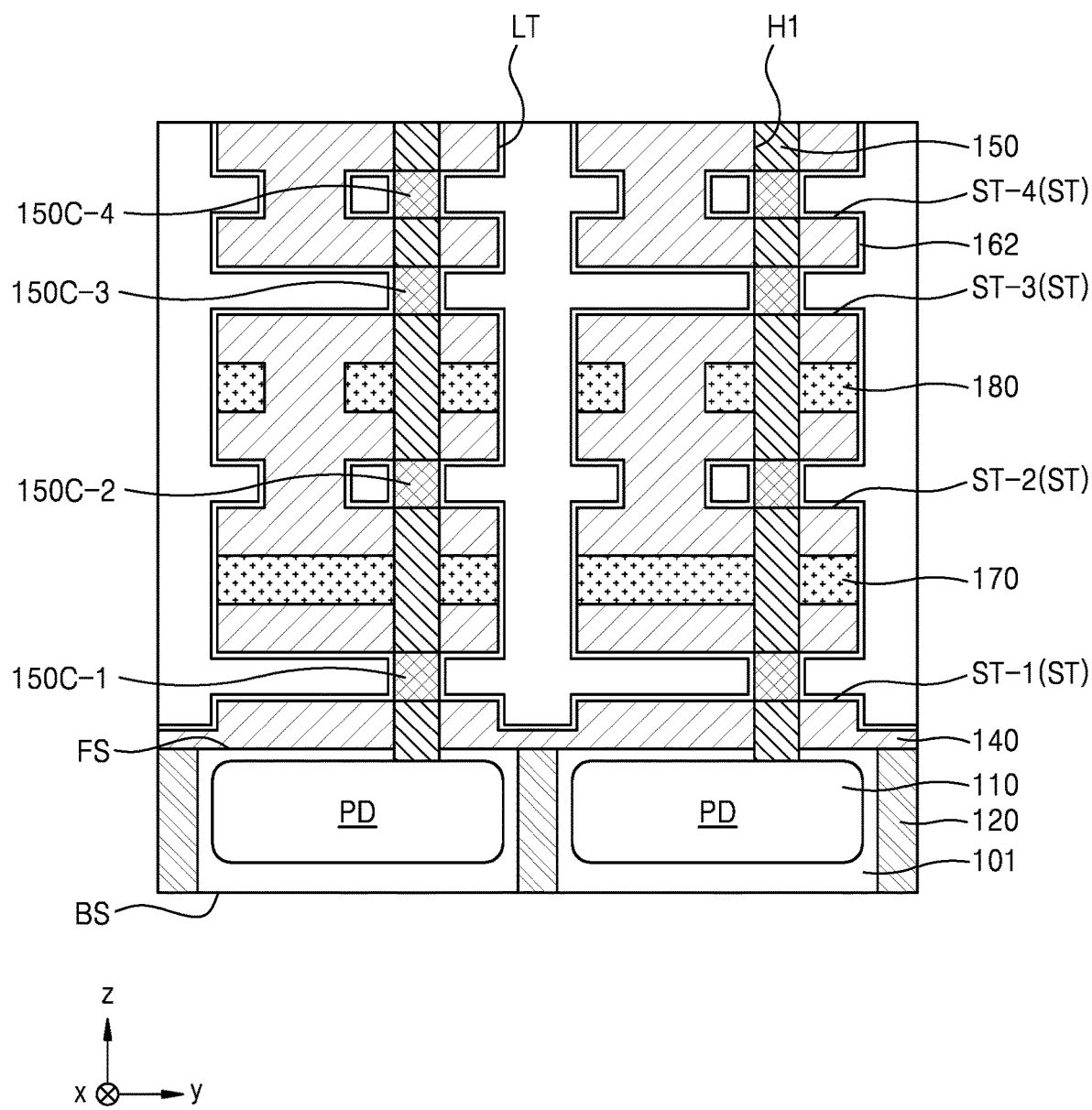

Referring to FIG. 15, the insulation layer 162 is formed on portions exposed through the line trenches LT and the horizontal trenches ST (e.g., ST-1, ST-2, ST-3 and ST-4). The insulation layer 162 may include, for example, an oxide like silicon oxide. Portions of the insulation layer 162 that cover the channel areas 150C-1 to 150C-4 of the active pillar 150 may correspond to a gate insulation layer.

Figure 16A:
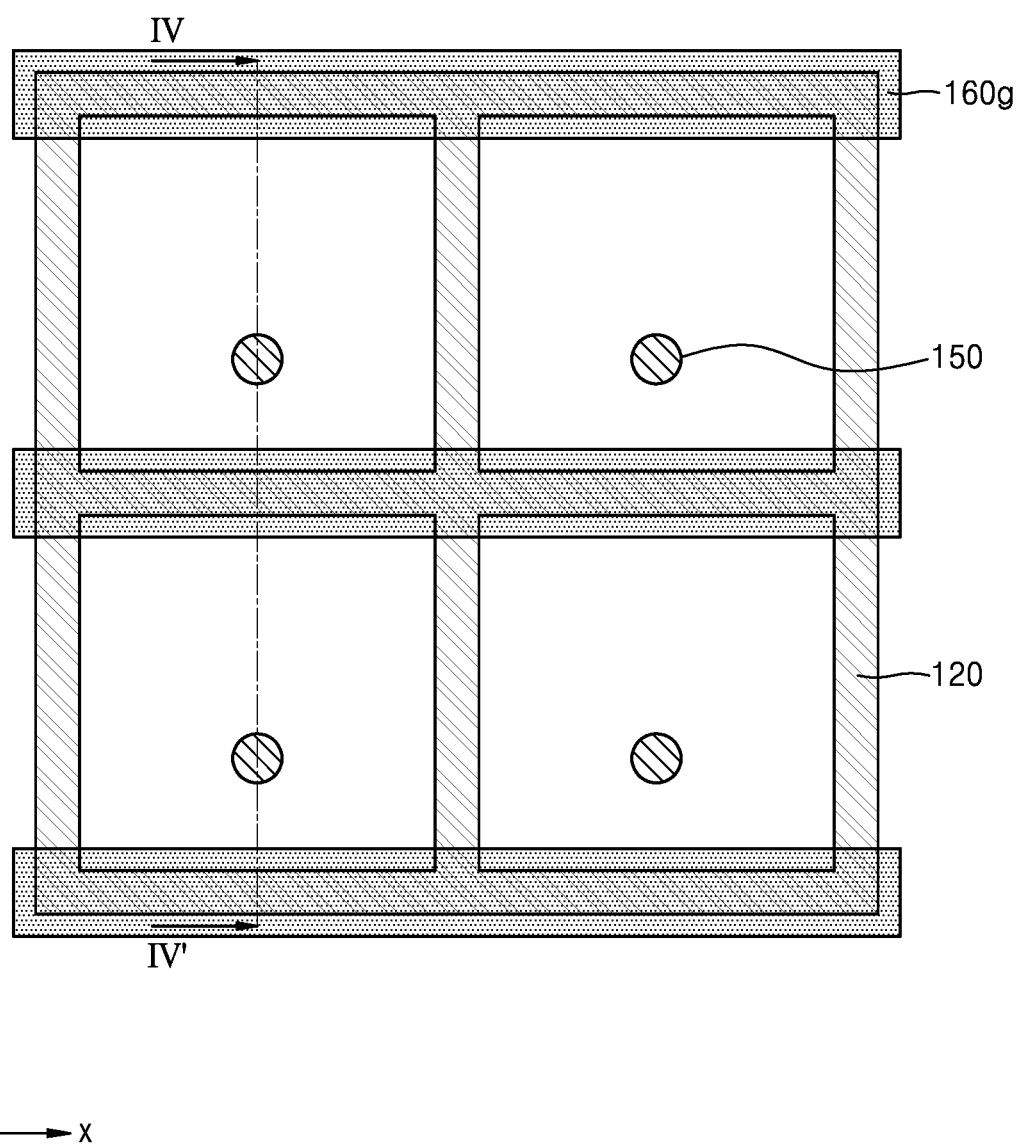
Figure 16B:
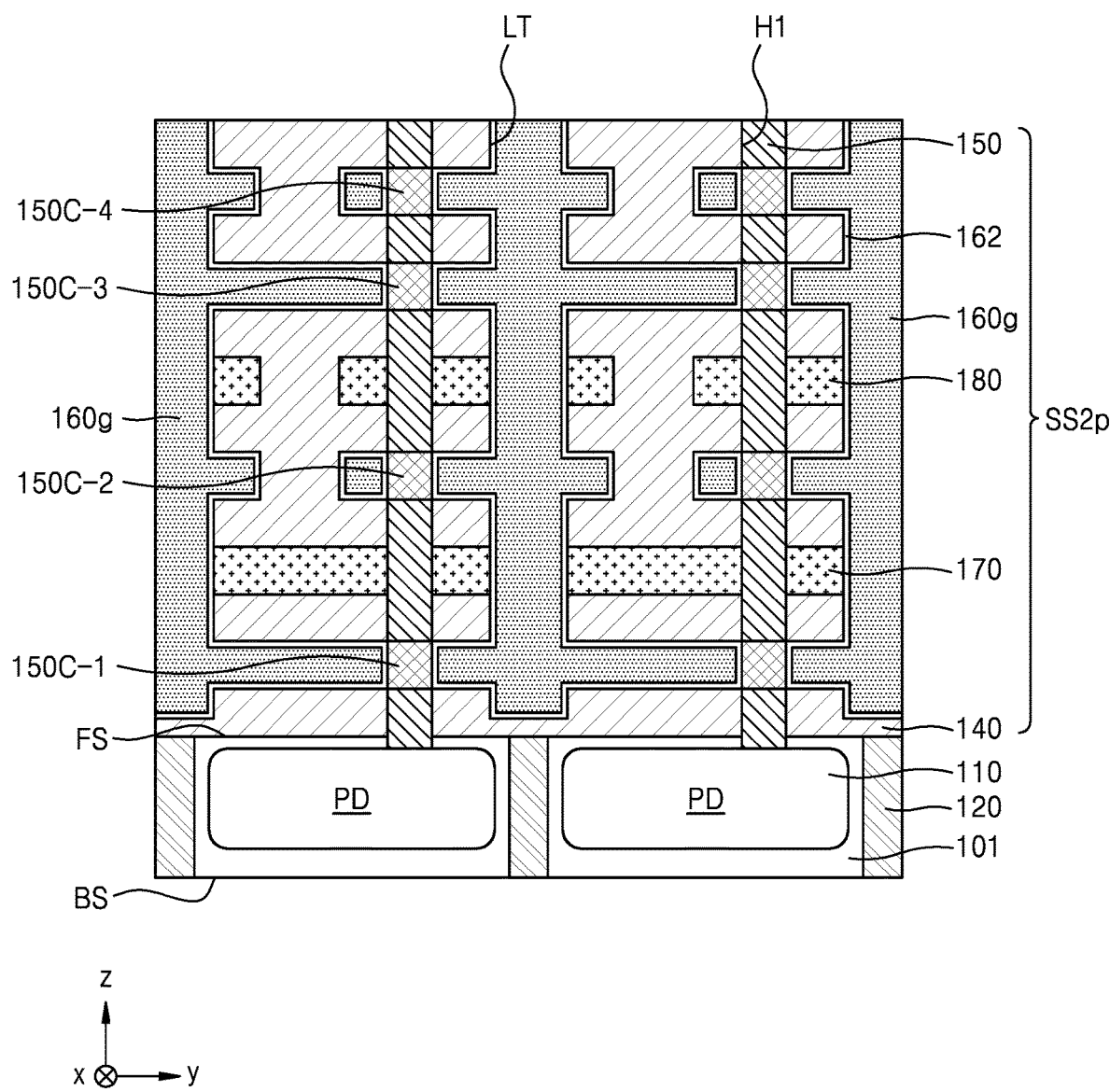

Referring to FIGS. 16A and 16B, a gate material layer 160g filling the line trenches LT and the horizontal trenches ST is formed. The gate material layer 160g may include, for example, polysilicon. However, the material constituting the gate material layer 160g is not limited to polysilicon. For example, the gate material layer 160g may include a metal, a metal silicide, a metal-containing conductive material, etc. The gate material layer 160g may become a gate and/or a gate line layer after the dividing area DA is formed. A preliminary second stacked structure SS2p may be formed through the formation of the gate material layer 160g. A process of forming the gate material layer 160g may correspond to a process in which the sacrificial layer 167 is replaced with the gate material layer 160g, and thus the process of forming the gate material layer 160g may be referred to as a replacement process.

Figure 17A:
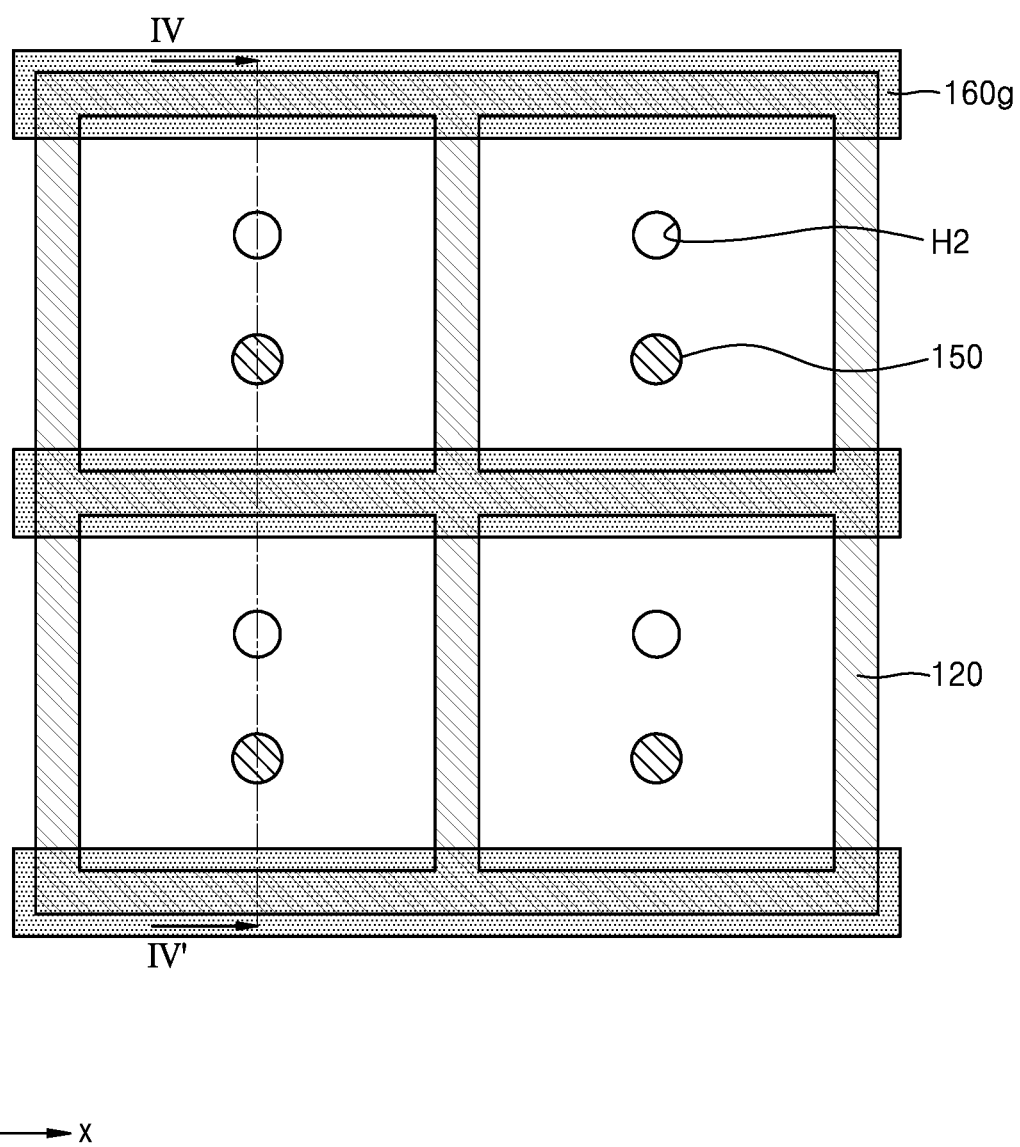
Figure 17B:
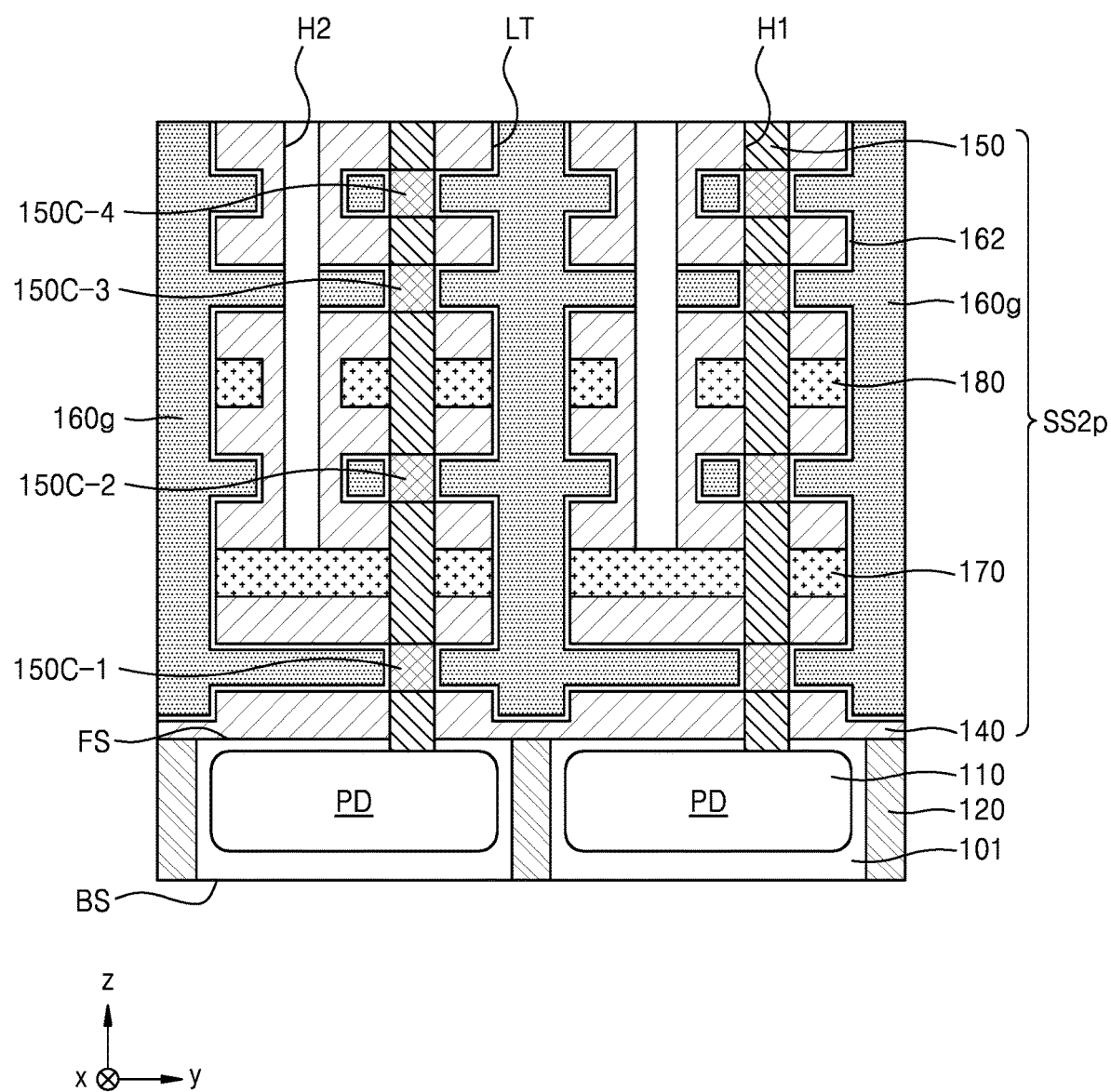

Referring to FIGS. 17A and 17B, second through holes H2 exposing the top surface of the first conductive layer 170 by penetrating portions of the preliminary second stacked structure SS2p are formed. The second through holes H2 may penetrate through portions filled with the insulation layer 140 in the second sacrificial layer pattern 167-2, the second conductive layer pattern 180, and the fourth sacrificial layer pattern 167-4. Therefore, the first conductive layer 170 may be exposed through the bottom surface of the second through holes H2, and the insulation layer 140 and the gate material layer 160g may be exposed through the side surfaces of the second through holes H2. An exposed portion of the gate material layer 160g may correspond to a portion in which the third sacrificial layer 167-3 is replaced with the gate material layer 160g.

The second through holes H2 may be formed to have a smaller size than the first through holes H1. However, in some embodiments of the inventive concept, the second through holes H2 may be formed to have substantially the same size as the first through holes H1. In addition, a horizontal cross-section of a second through hole H2 may have a circular shape, an elliptical shape, or a polygonal shape similar to that of the horizontal cross-section of the first through hole H1.

Figure 18A:
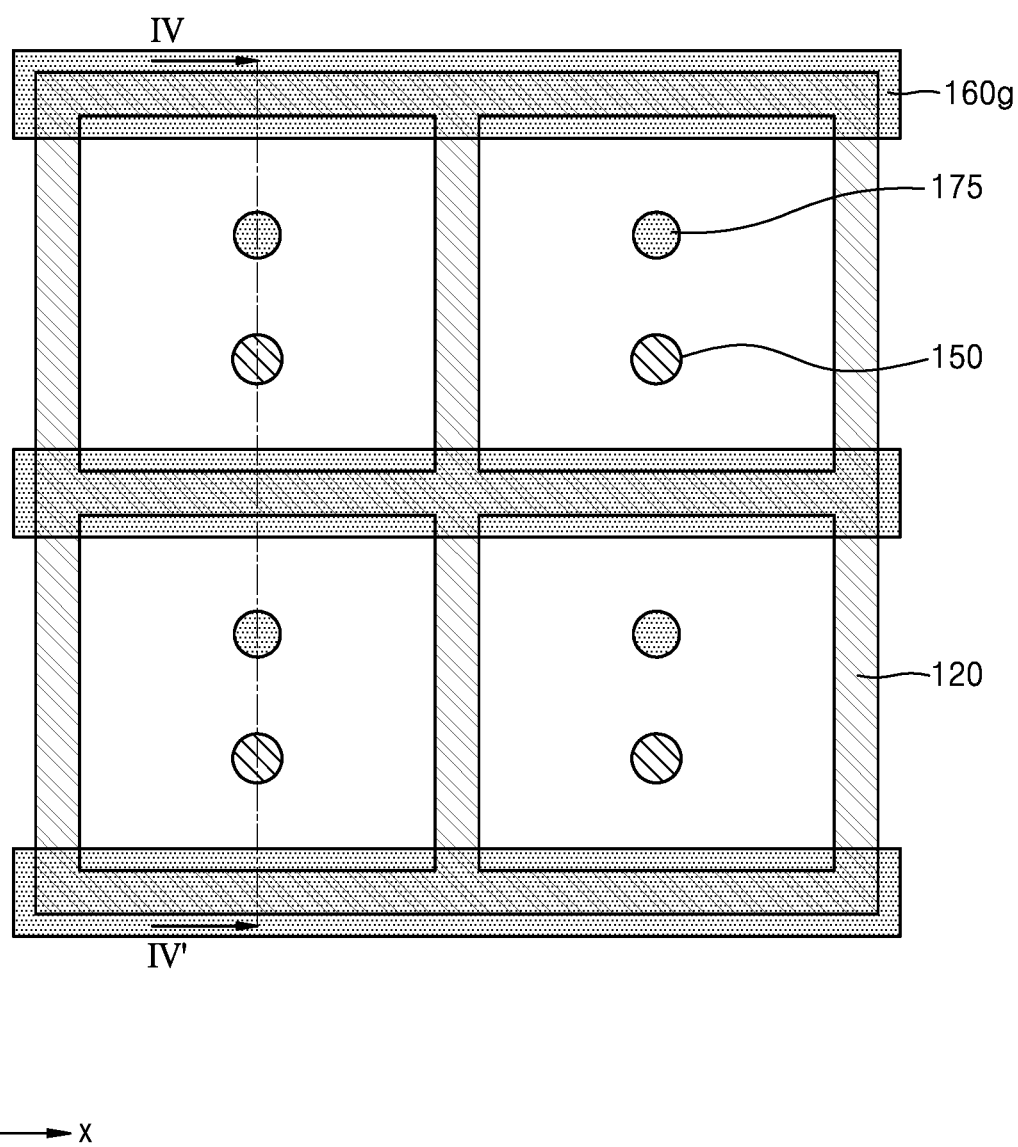
Figure 18B:
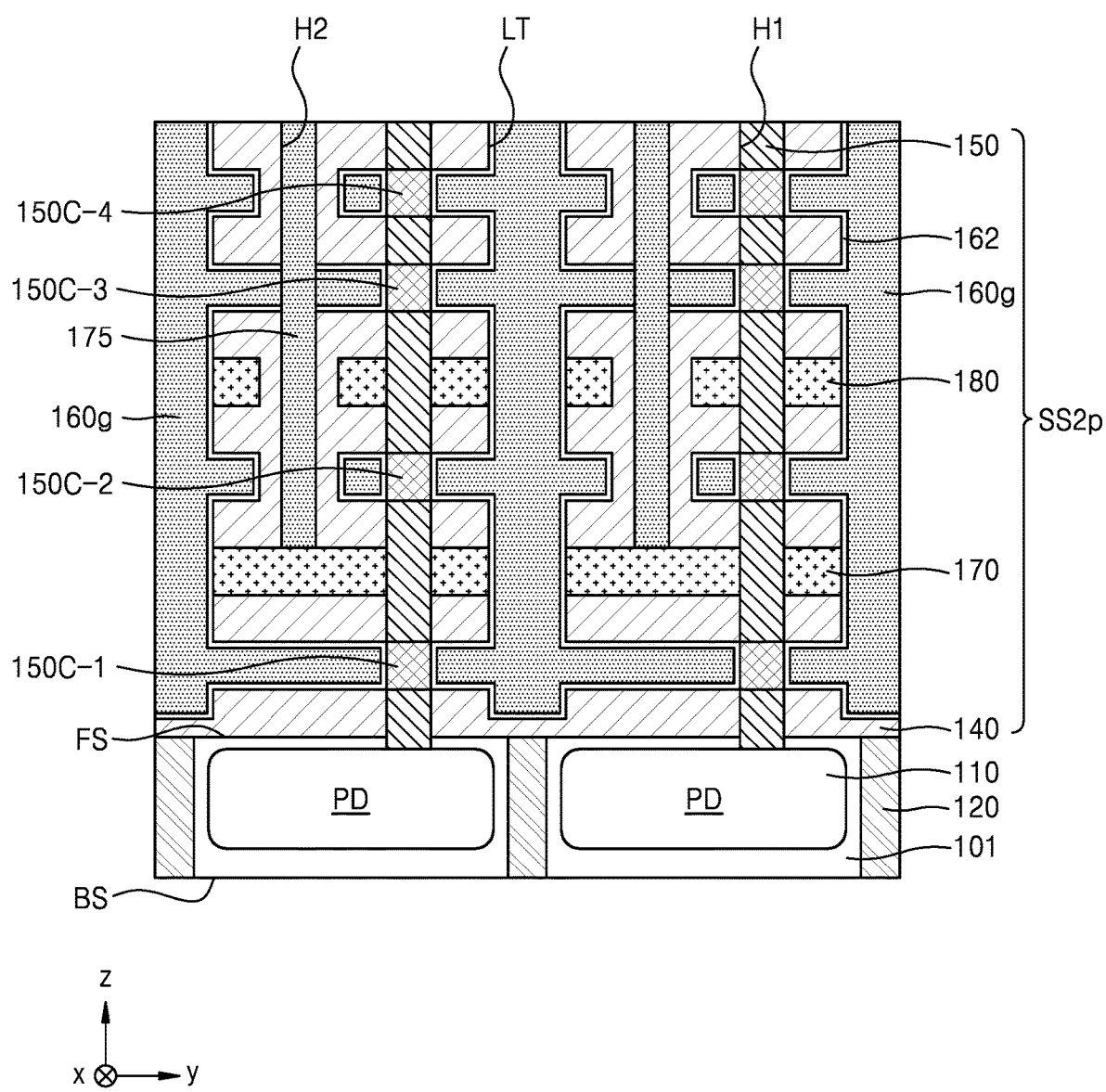

Referring to FIGS. 18A and 18B, FD straps 175 are formed by filling the second through holes H2 with a conductive material. The FD straps 175 may include, for example, polysilicon. However, the material constituting FD straps 175 is not limited to polysilicon. For example, the FD straps 175 may include a metal, a metal silicide, a metal-containing conductive material, etc. Lower ends of the FD straps 175 may be connected to the FD area 170. For example, the lower ends of the FD straps 175 may directly contact the FD area 170 exposed through the bottom surface of the second through holes H2.

Figure 19A:
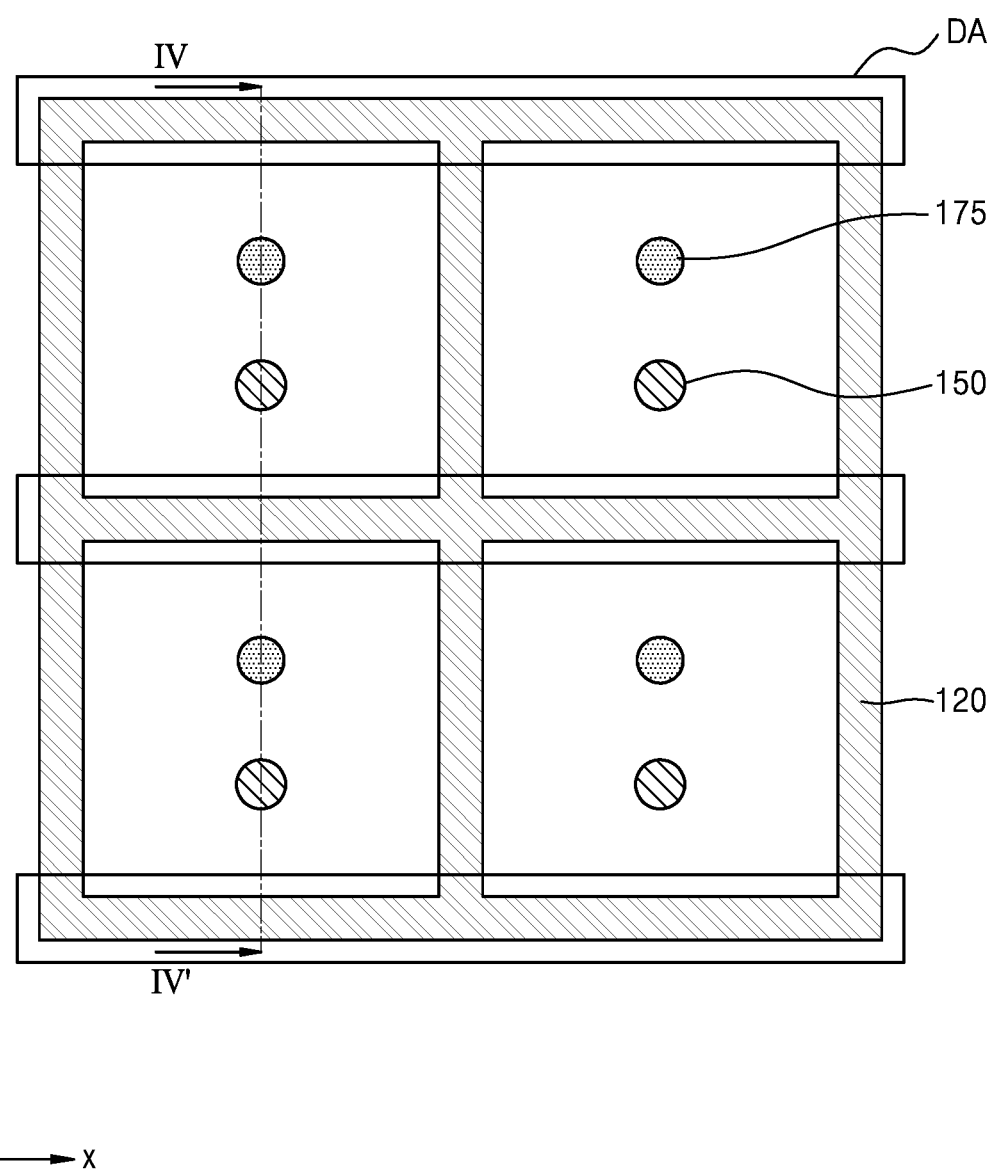
Figure 19B:
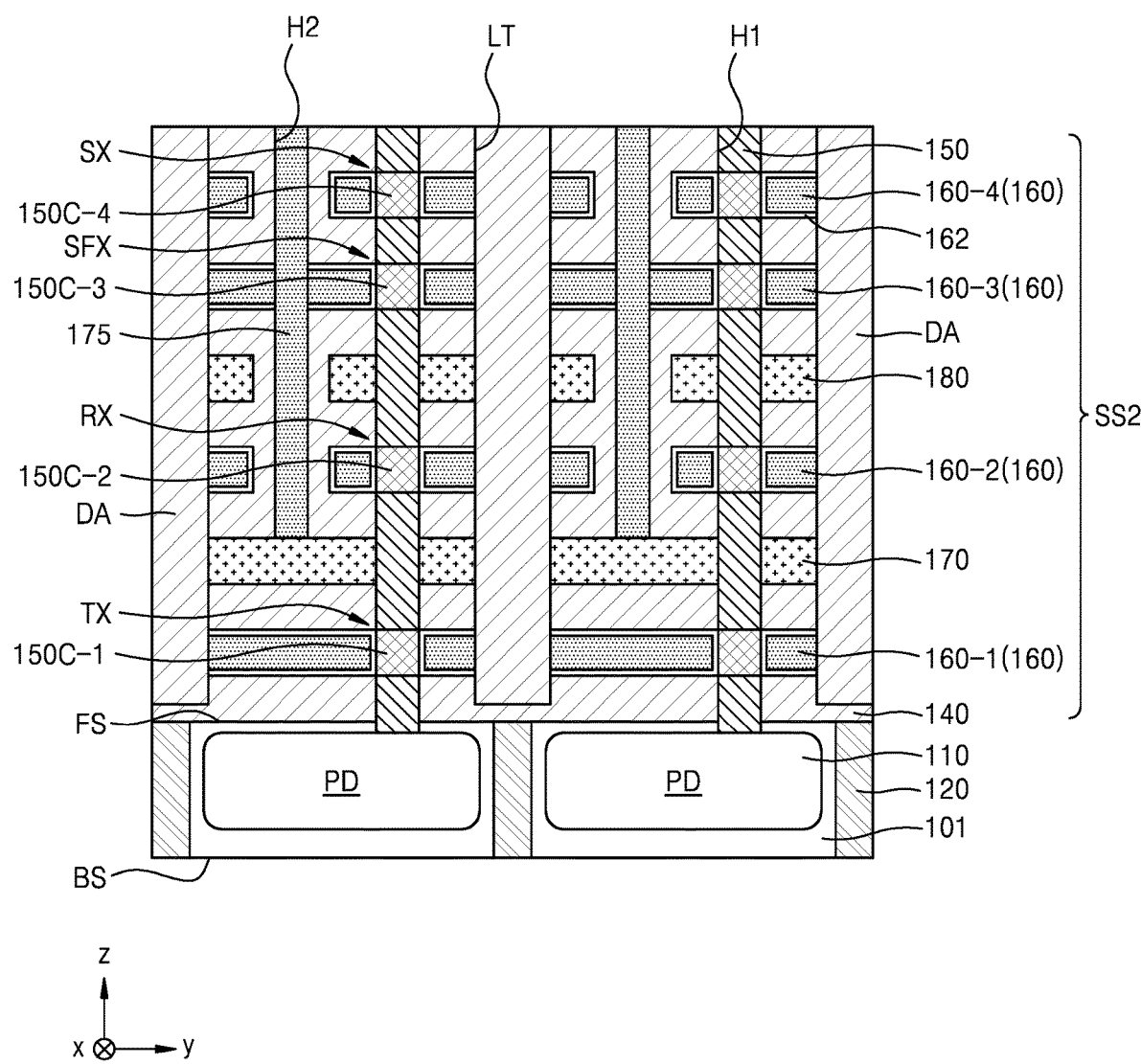

Referring to FIGS. 19A and 19B, the gate material layer 160g and the insulation layer 162 in the line trenches LT are removed. The gate material layer 160g and the insulation layer 162 may be removed by dry etching or wet etching. Dividing areas DA are formed by filling portions in which the gate material layer 160g and the insulation layer 162 are removed with an insulation material. The dividing areas DA may include, for example, an oxide like silicon oxide. By forming the dividing areas DA, a second stacked structure SS2 may be completed.

The dividing areas DA may be formed to extend in the first direction (x direction) and to have a predetermined interval in the second direction (y direction) in correspondence to the structure of the line trenches LT. Therefore, the second stacked structure SS2 may be separated in the second direction (y direction) by the dividing areas DA. The second stacked structure SS2 may correspond to the stacked structure SS in the image sensor 100 of FIG. 2C. In addition, when the first direction (x direction) is referred to as a row direction, the dividing areas DA may be referred to as row line dividing areas based on the shape in which the dividing areas DA extend in the row direction.

Figure 20A:
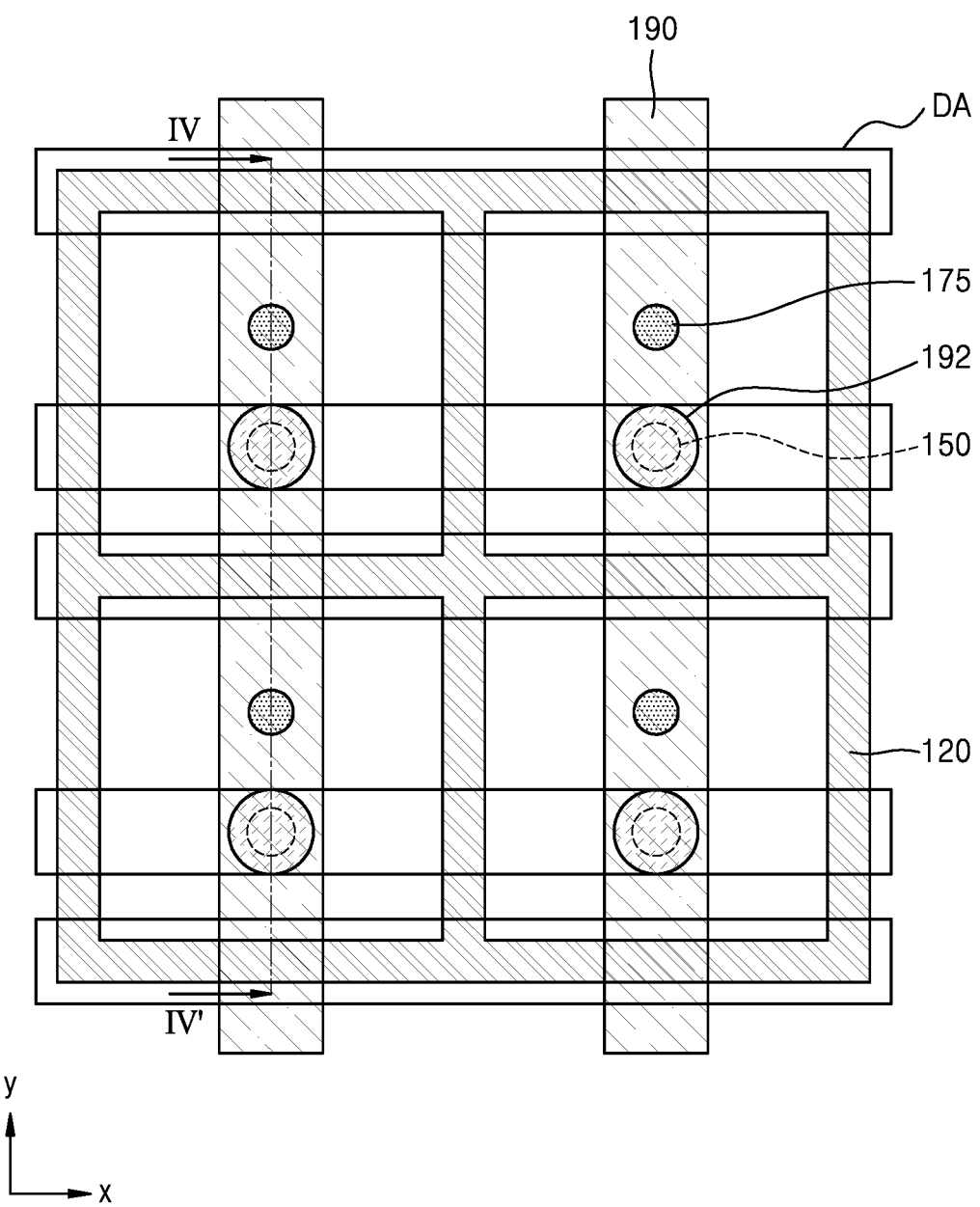
Figure 20B:
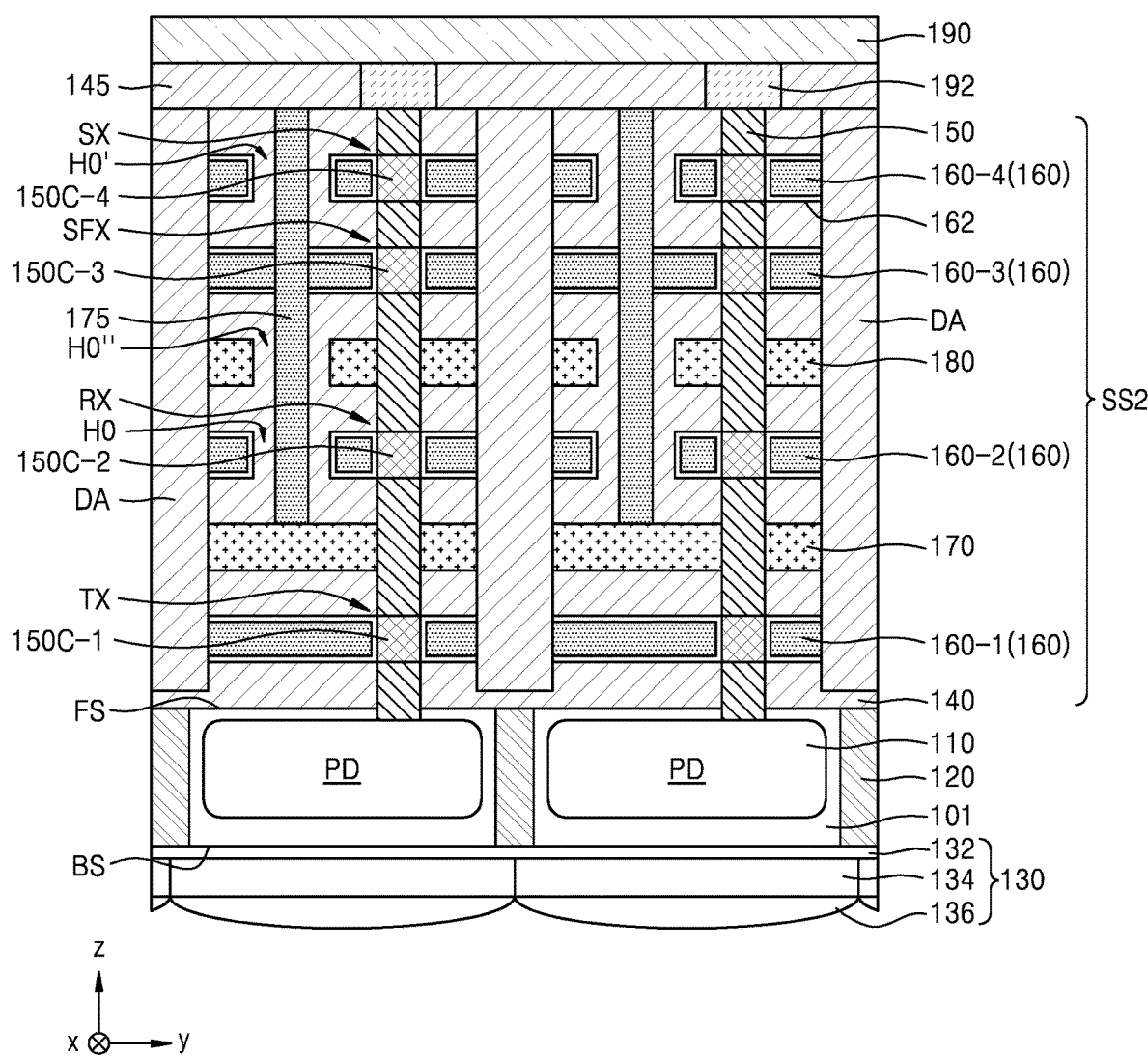

Referring to FIGS. 20A and 20B, the upper insulation layer 145 and contacts 192 are formed on the second stacked structure SS2. The contacts 192 may be formed on the top surface of the active pillars 150. Thereafter, the output line layer 190 extending in the second direction (y direction) may be formed on the upper insulation layer 145 and the contacts 192. The output line layer 190 may be connected to the active pillars 150 through the contacts 192. For example, the output line layer 190 may be connected to a drain area of the selection transistor SX through the contact 192. In addition, when the second direction (y direction) is referred to as a column direction, the output line layer 190 may be referred to as a column output line layer based on a form in which the output line layer 190 extends in the column direction.

Thereafter, the vertical contacts 165 and the first electrode pads 195 are formed in the first peripheral area PE1, and the light transmitting layer 130 is formed on the bottom surface of the substrate 101. Therefore, the first semiconductor chip 100-1 may be completed. Subsequently, the image sensor 100 of FIG. 2C may be completed by coupling the first semiconductor chip 100-1 to the second semiconductor chip 100-2 through Cu-to-Cu bonding.

While the inventive concept has been particularly shown and described with reference to embodiments thereof, it will be understood that various changes in form and details may be made therein without departing from the spirit and scope of the following claims.

What is claimed is:
1. An image sensor, comprising:
   photodiodes arranged in a substrate;
   active pillars connected to the photodiodes and extending in a vertical direction perpendicular to a bottom surface of the substrate;

at least two transistors stacked in the vertical direction, wherein portions of the active pillars are channel areas of the at least two transistors;

a floating diffusion (FD) area disposed under a transfer transistor, which is one of the at least two transistors, wherein the FD area is configured to receive charge from the photodiode through the transfer transistor and the portions of the active pillars; and a light transmitting layer disposed on a top surface of the substrate, wherein the photodiodes, the at least two transistors, the FD area, and the light transmitting layer are formed on a first semiconductor chip, and the image sensor further comprises a second semiconductor chip coupled to a bottom surface of the first semiconductor chip and including logic elements.

2. The image sensor of claim 1, wherein the at least two transistors comprise a reset transistor and a source follower transistor arranged below the FD area, and the image sensor further comprises FD straps extending in the vertical direction from the FD area and connected to a gate of the source follower transistor.

3. The image sensor of claim 1, wherein the photodiodes are arranged in a 2-dimensional array structure in the substrate and are separated from one another by a 2-dimensional lattice-like pixel isolation structure, and each of the at least two transistors comprises:

the channel area, source and drain areas that are portions of the active pillars on both sides of the channel area in the vertical direction, and a gate surrounding the channel area in a gate all around (GAA) structure.

4. The image sensor of claim 3, wherein the FD area surrounds portions of the active pillars and has a flat plate-like shape parallel to the bottom surface of the substrate, wherein the image sensor further comprises:

gate line layers that form gates of the at least two transistors and extend in a first direction in the form of a flat plate-like shape, a reset transistor of the at least two transistors disposed below the FD area, a power line layer that surrounds portions of the active pillars and extends in the first direction in a flat plate-like shape and is configured to apply a power voltage to the reset transistor and is disposed below the reset transistor, dividing areas arranged on the substrate and extending in the first direction, and the FD area, the gate line layers, and the power line layer are separated from one another in a second direction perpendicular to the first direction by the dividing areas.

5. The image sensor of claim 4, wherein the gate line layers and the power line layer form a step-like structure at end portions thereof in the first direction and are connected to corresponding first electrode pads through vertical contacts, and an open hole through which an FD strap extending in the vertical direction from the FD area passes is formed in at least one of the gate line layers and the power line layer.

6. The image sensor of claim 4, wherein the gate line layers have substantially the same width as one another in the second direction, and the power line layer has substantially the same width as each of the gate line layers in the second direction.

7. The image sensor of claim 4, wherein the FD area directly contacts the active pillars, and each of the gate line layers surrounds a corresponding active pillar with a gate insulation layer therebetween.

8. The image sensor of claim 1, wherein the at least two transistors comprise the transfer transistor and a reset transistor, a source follower transistor, and a selection transistor that are sequentially stacked under the transfer transistor, wherein the image sensor further comprises:

a gate line layer connected to a gate of each of the at least two transistors and extending in a first direction in a flat plate-like shape, a power line layer that surrounds portions of the active pillars and extends in a first direction in a flat plate-like shape and is configured to apply a power voltage to the reset transistor and is disposed below the reset transistor, wherein the gate line layers and the power line layer are connected to corresponding first electrode pads through vertical contacts at an end portion in the first direction, and at least one of the first electrode pads is disposed on the bottom surface of the first semiconductor chip and bonded to a second electrode pad disposed on a top surface of the second semiconductor chip.

9. The image sensor of claim 1, further comprising:

a gate line layer connected to a gate of each of the at least two transistors and extending in the first direction in a flat plate-like shape, wherein the gate line layers are connected to corresponding first electrode pads for gate through vertical contacts at end portions thereof in a first direction, an output line layer extending in a second direction perpendicular to the first direction on the bottom surface of the first semiconductor chip, connected to a selection transistor of the at least two transistors, and directly connected to a corresponding first electrode pad for output, and the first electrode pad for gate and the first electrode pad for output are disposed on the bottom surface of the first semiconductor chip and bonded to second electrode pads disposed on a top surface of the second semiconductor chip.

10. An image sensor, comprising:

a first semiconductor chip comprising photodiodes in a substrate, active pillars connected to the photodiodes and extending in a vertical direction perpendicular to a bottom surface of the substrate, a stacked structure in which conductive layers and insulation layers are alternately stacked to surround the active pillars, and a light transmitting layer disposed on a top surface of the substrate; and a second semiconductor chip coupled to a bottom surface of the first semiconductor chip and including logic elements, wherein the stacked structure comprises a stacked transistor structure in which at least two transistors using at least portions of the active pillars as a channel area are stacked.

11. The image sensor of claim 10, wherein the stacked transistor structure includes four transistors for outputting signals from the photodiodes, wherein the image sensor further comprises:

dividing areas extending in a first direction and penetrating through the stacked structure are arranged on the substrate,
wherein the conductive layers of the stacked structure extend in the first direction and are separated from one another in a second direction perpendicular to the first direction by the dividing areas,
portions of the active pillars and a portion of a first conductive layer constitute a transfer transistor,
a second conductive layer constitutes a floating diffusion (FD) area,
portions of the active pillars and a portion of a third conductive layer constitute a transfer transistor,
a fourth conductive layer constitutes a power line layer for applying a power voltage to a reset transistor, and
an FD strap extending in the vertical direction from the FD area and connected to a gate of a source follower transistor penetrates through a portion of the stacked structure.

12. An image sensor, comprising:
a first stacked structure extending in a first direction; and
a second stacked structure extending in the first direction in parallel with the first stacked structure and insulated from the first stacked structure in a second direction perpendicular to the first direction,
wherein each of the first stacked structure and second stacked structure comprises a plurality of pixels and first electrode pads formed at ends thereof in the first direction,
each of the pixels comprises a photodiode, an active pillar connected to the photodiode and extending in a vertical direction, and a plurality of stacked transistors using the active pillar as a channel, and
the first electrode pads are coupled to at least one gate of the stacked transistors.

13. The image sensor of claim 12,
wherein the stacked transistors comprise a transfer transistor, a reset transistor, and a selection transistor, and
the first electrode pads are connected to gate lines of the transfer transistor, the reset transistor, and the select transistor.

14. The image sensor of claim 12,
wherein each of the pixels comprises:
the photodiode arranged in a substrate;
the active pillar connected to the photodiode and extending in the vertical direction from a bottom surface of the substrate;
the stacked transistors, which use the portion of the active pillar as the channel, stacked in the vertical direction; and
a floating diffusion (FD) area disposed below a transfer transistor, which is an uppermost transistor from among the stacked transistors, wherein the FD area is configured to receive charges from the photodiode through the transfer transistor and the portion of the active pillar.

15. The image sensor of claim 14,
wherein the stacked transistors comprise a transfer transistor, a reset transistor, a source follower transistor, and a selection transistor sequentially stacked on the bottom surface of the substrate, and
the FD area is disposed between the transfer transistor and the reset transistor.

16. The image sensor of claim 15,
wherein the FD area is connected to an FD strap extending in the vertical direction, and
the FD strap is connected to a gate of the source follower transistor.

17. The image sensor of claim 15,
wherein gates of the stacked transistors are included in gate lines extending in the first direction,
the gate lines have a flat plate-like shape extending in the first direction, and
the stacked transistors are formed in an area where the active pillar penetrates through the gate lines.

18. The image sensor of claim 15,
further comprising a power line connected to the active pillar, disposed between the reset transistor and the source follower transistor, and extending in the first direction,
wherein gates of the stacked transistors are included in gate lines extending in the first direction, and
the power line has substantially the same width as the gate line.

19. The image sensor of claim 18,
wherein the active pillar extends through the power line, and
an open hole through which an FD strap extending in the vertical direction from the FD area passes is formed in the power line.

* * * * *